(12) United States Patent
Yoon et al.

(10) Patent No.: US 10,580,688 B2
(45) Date of Patent: Mar. 3, 2020

(54) METHOD OF MANUFACTURING SEMICONDUCTOR DEVICE

(71) Applicant: Samsung Electronics Co., Ltd., Suwon-si, Gyeonggi-do (KR)

(72) Inventors: Hyun-Chul Yoon, Seongnam-si (KR); Yeong-Shin Park, Seoul (KR); Joonghee Kim, Anyang-si (KR); Jihee Kim, Yongin-si (KR); Dongjun Shin, Suwon-si (KR); Kukhan Yoon, Hwasung-si (KR); Taeseop Choi, Hwaseong-si (KR); Jungheun Hwang, Daejeon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/037,460

(22) Filed: Jul. 17, 2018

(65) Prior Publication Data
US 2019/0214295 A1 Jul. 11, 2019

(30) Foreign Application Priority Data
Jan. 11, 2018 (KR) .................. 10-2018-0003767

(51) Int. Cl.
*H01L 21/033* (2006.01)
*H01L 21/768* (2006.01)
(Continued)

(52) U.S. Cl.
CPC .... *H01L 21/76802* (2013.01); *H01L 21/0274* (2013.01); *H01L 21/0332* (2013.01); *H01L 21/0337* (2013.01); *H01L 21/0338* (2013.01); *H01L 21/31116* (2013.01); *H01L 21/31138* (2013.01); *H01L 21/31144* (2013.01); *H01L 21/76877* (2013.01); *H01L 21/76895* (2013.01); *H01L 27/10823* (2013.01); *H01L 27/10852* (2013.01); *H01L 27/10855* (2013.01);
(Continued)

(58) Field of Classification Search
None
See application file for complete search history.

(56) References Cited

U.S. PATENT DOCUMENTS 7,820,553 B2  10/2010  Chu et al.
9,209,028 B2  12/2015  Xu et al.
(Continued)

FOREIGN PATENT DOCUMENTS

KR  10-2004-0087459 A  10/2004
KR  10-2006-0017170 A  2/2006
(Continued)

*Primary Examiner* — Bradley Smith
(74) *Attorney, Agent, or Firm* — Harness, Dickey & Pierce, P.L.C.

(57) ABSTRACT

Disclosed is a method of fabricating a semiconductor device. The method comprises stacking an etching target layer, a first mask layer, an under layer, and a photoresist layer on a substrate, irradiating extreme ultraviolet (EUV) radiation on the photoresist layer to form a photoresist pattern, and performing a nitrogen plasma treatment on the photoresist pattern while using the first mask layer as an etching stop layer, the performing continuing until a top surface of the first mask layer is exposed. During the performing, the under layer is etched to form an under pattern below the photoresist pattern.

18 Claims, 34 Drawing Sheets

(51) Int. Cl.
*H01L 21/311* (2006.01)
*H01L 21/027* (2006.01)
*H01L 29/66* (2006.01)
*H01L 27/108* (2006.01)
*H01L 27/22* (2006.01)
*H01L 27/24* (2006.01)
*H01L 45/00* (2006.01)
*H01L 43/12* (2006.01)

(52) U.S. Cl.
CPC .. *H01L 27/10876* (2013.01); *H01L 27/10897* (2013.01); *H01L 27/22* (2013.01); *H01L 27/24* (2013.01); *H01L 29/66477* (2013.01); *H01L 27/1085* (2013.01); *H01L 43/12* (2013.01); *H01L 45/06* (2013.01); *H01L 45/08* (2013.01); *H01L 45/16* (2013.01)

(56) References Cited

U.S. PATENT DOCUMENTS

| | | |
|---|---|---|
| 9,543,159 B2 | 1/2017 | Chen et al. |
| 9,583,345 B2 | 2/2017 | Chen et al. |
| 9,618,848 B2 | 4/2017 | Carcasi et al. |
| 2006/0040216 A1 | 2/2006 | Lee |
| 2006/0040474 A1* | 2/2006 | Shieh ............... G03F 7/427 |
| | | 438/474 |
| 2011/0174774 A1 | 7/2011 | Lin et al. |
| 2014/0167227 A1* | 6/2014 | Yen ............... H01L 21/31116 |
| | | 257/632 |
| 2016/0268336 A1* | 9/2016 | Shum ............... H01L 43/12 |

FOREIGN PATENT DOCUMENTS

| | | |
|---|---|---|
| KR | 10-1094332 B1 | 12/2011 |
| KR | 10-2014-0088030 A | 7/2014 |
| KR | 10-2016-0115667 A | 10/2016 |
| KR | 10-2016-0124807 A | 10/2016 |

* cited by examiner

METHOD OF MANUFACTURING SEMICONDUCTOR DEVICE

CROSS-REFERENCE TO RELATED APPLICATIONS

This U.S. nonprovisional application claims priority under 35 U.S.C § 119 to Korean Patent Application No. 10-2018-0003767 filed on Jan. 11, 2018, in the Korean Intellectual Property Office, the entire contents of which are hereby incorporated by reference.

BACKGROUND

Inventive concepts relate to a method of manufacturing a semiconductor device, and more particularly, to a method of manufacturing a semiconductor device in which the method uses an extreme ultraviolet (EUV) photolithography process.

Semiconductor devices are widely used in the electronic industry because of their small size, multi-functionality, and/or low fabrication cost. Semiconductor devices may encompass a memory device for storing data, a logic device for processing data, and a hybrid device for operating various functions contemporaneously or simultaneously.

Semiconductor devices have been progressively required for high integration with the advanced development of the electronic industry. Manufacturing semiconductor devices is therefore becoming difficult because there may be some challenges of process margin reduction in an exposure process defining fine patterns. Semiconductor devices also have been increasingly requested for high speed with the advanced development of the electronic industry. Various studies have been conducted to meet the requirements of high integration and/or high speed in semiconductor devices.

SUMMARY

Some example embodiments of inventive concepts provide a method of manufacturing a semiconductor device in which method desired patterns are formed.

According to some example embodiments of inventive concepts, a method of manufacturing a semiconductor device may include stacking an etching target layer, a first mask layer, an under layer, and a photoresist layer on a substrate, irradiating extreme ultraviolet (EUV) radiation on the photoresist layer to form a photoresist pattern, and performing a nitrogen plasma treatment on the photoresist pattern while using the first mask layer as an etching stop layer, the performing continuing until a top surface of the first mask layer is exposed. During the performing, the under layer is etched to form an under pattern below the photoresist pattern.

According to some example embodiments of inventive concepts, a method of manufacturing a semiconductor device may include forming a gate electrode to run across an active pattern of a first region of a substrate, forming an impurity region in the active pattern, the impurity region adjacent to a side of the gate electrode, forming a conductive layer on the gate electrode, and patterning the conductive layer to form a first conductive pattern electrically connected to the impurity region. The patterning the conductive layer includes forming a photoresist layer on the conductive layer, irradiating extreme ultraviolet (EUV) radiation on the photoresist layer to form a photoresist pattern, and performing a nitrogen plasma treatment on the photoresist pattern. The performing includes using a process gas consisting essentially of nitrogen.

According to some example embodiments of inventive concepts, a method of manufacturing a semiconductor device may include forming an interlayer dielectric layer on a substrate, forming an opening in the interlayer dielectric layer, and filling the opening with a conductive material to form a conductive pattern. Forming the opening includes forming a photoresist layer on the interlayer dielectric layer, irradiating extreme ultraviolet (EUV) radiation on the photoresist layer to form a photoresist pattern, and performing a nitrogen plasma treatment on the photoresist pattern. The performing includes using a process gas consisting essentially of nitrogen.

DETAILED DESCRIPTION OF EXAMPLE EMBODIMENTS

Figure 9:
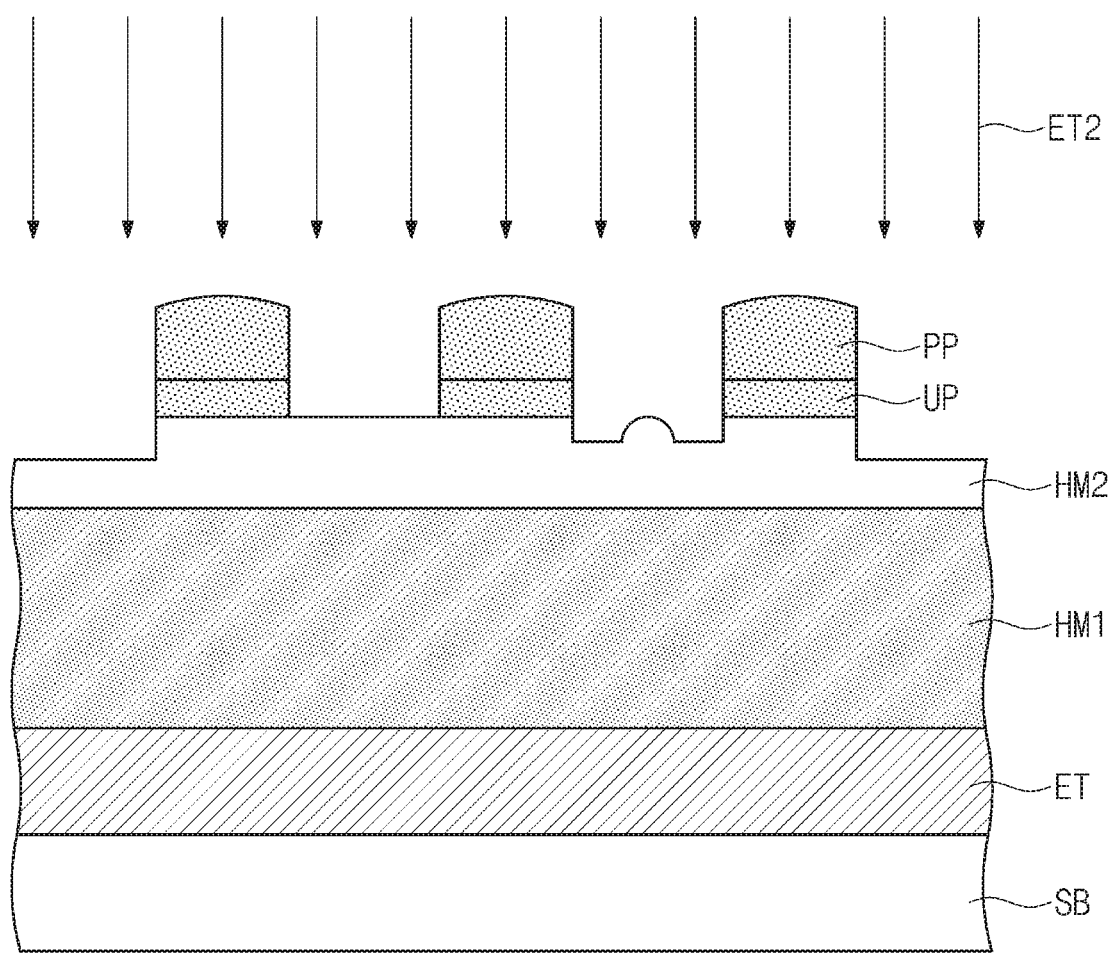
FIGS. 9 and 10 illustrate cross-sectional views according to a comparative example.
Figure 10:
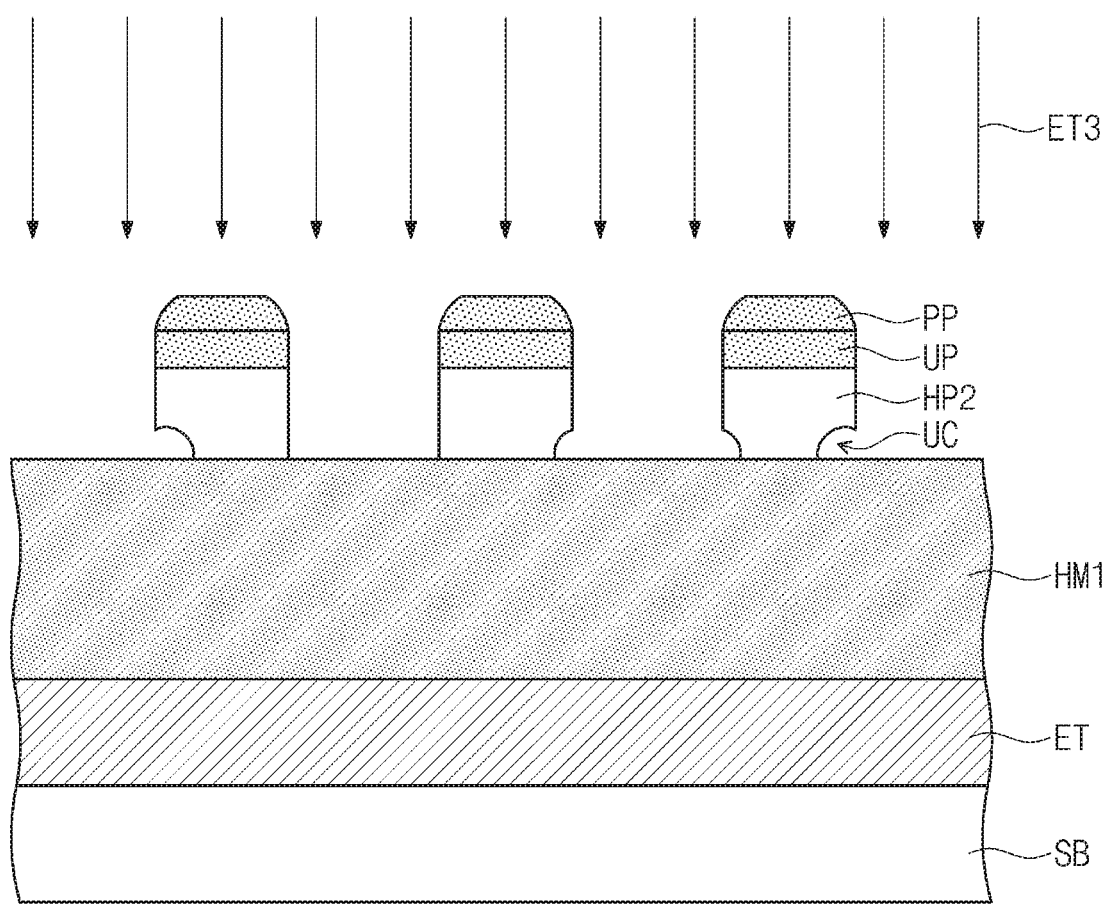

FIGS. 1 to 8 illustrate cross-sectional views showing a method of forming target patterns according to some example embodiments of inventive concepts. FIGS. 9 and 10 illustrate cross-sectional views according to a comparative example.

Figure 1:
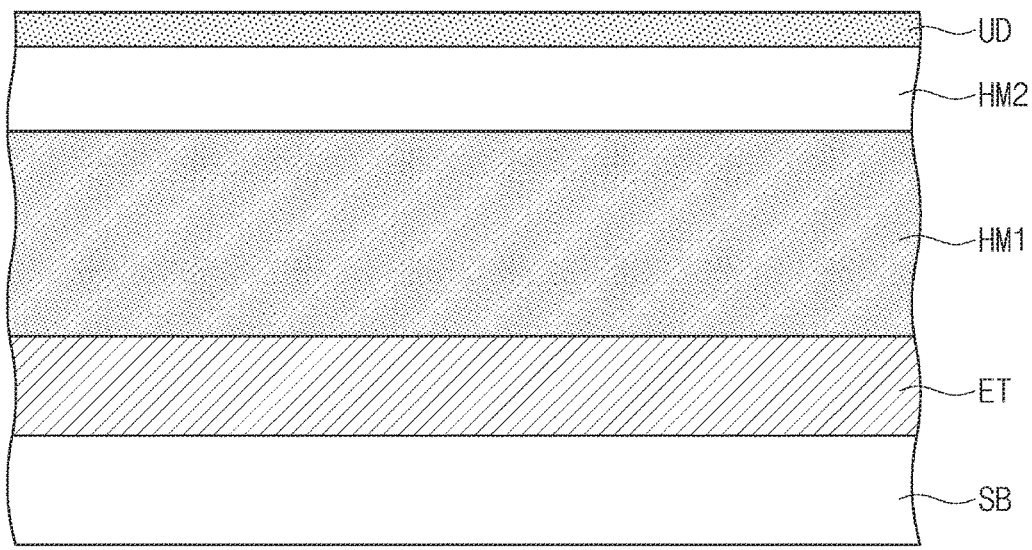
FIGS. 1 to 8 illustrate cross-sectional views showing a method of forming target patterns according to some example embodiments of inventive concepts.

Referring to FIG. 1, a substrate SB may be provided thereon with an etching target layer ET, a first mask layer HM1, a second mask layer HM2, and an under layer UD that are sequentially stacked on the substrate SB. For example, the substrate SB may be or include a silicon substrate, a germanium substrate, or a silicon-germanium substrate. The etching target layer ET may include a conductive material or an insulating material. The conductive material may include one or more of semiconductor (e.g., doped silicon, doped germanium, etc.), conductive metal nitride (e.g., titanium nitride, tantalum nitride, etc.), metal (e.g., tungsten, titanium, tantalum, etc.), and metal-semiconductor compound (e.g., tungsten silicide, cobalt silicide, titanium silicide, etc.). The insulating material may include one or more of a silicon oxide layer, a silicon nitride layer, and a silicon oxynitride layer.

The first mask layer HM1 may include a spin-on-hardmask (SOH) layer, a spin-on-carbon (SOC) layer, and/or an amorphous carbon layer. The second mask layer HM2 may include a silicon (Si) layer, a silicon oxide (SiO2) layer, a silicon nitride (Si3N4) layer, and/or a metal layer. The metal layer may include a titanium (Ti) layer, a tungsten (W) layer, a titanium oxide (TiO2) layer, and/or a titanium nitride (TiN) layer. The silicon (Si) layer may be or include an amorphous silicon layer, a single crystalline silicon layer, or a polycrystalline silicon layer.

The under layer UD may adhere a photoresist layer PR, which will be discussed below, to the second mask layer HM2. The under layer UD may include an organic polymer, for example, a novolac-based organic polymer, that can increase characteristics of adhesion to the photoresist layer PR.

Figure 2:
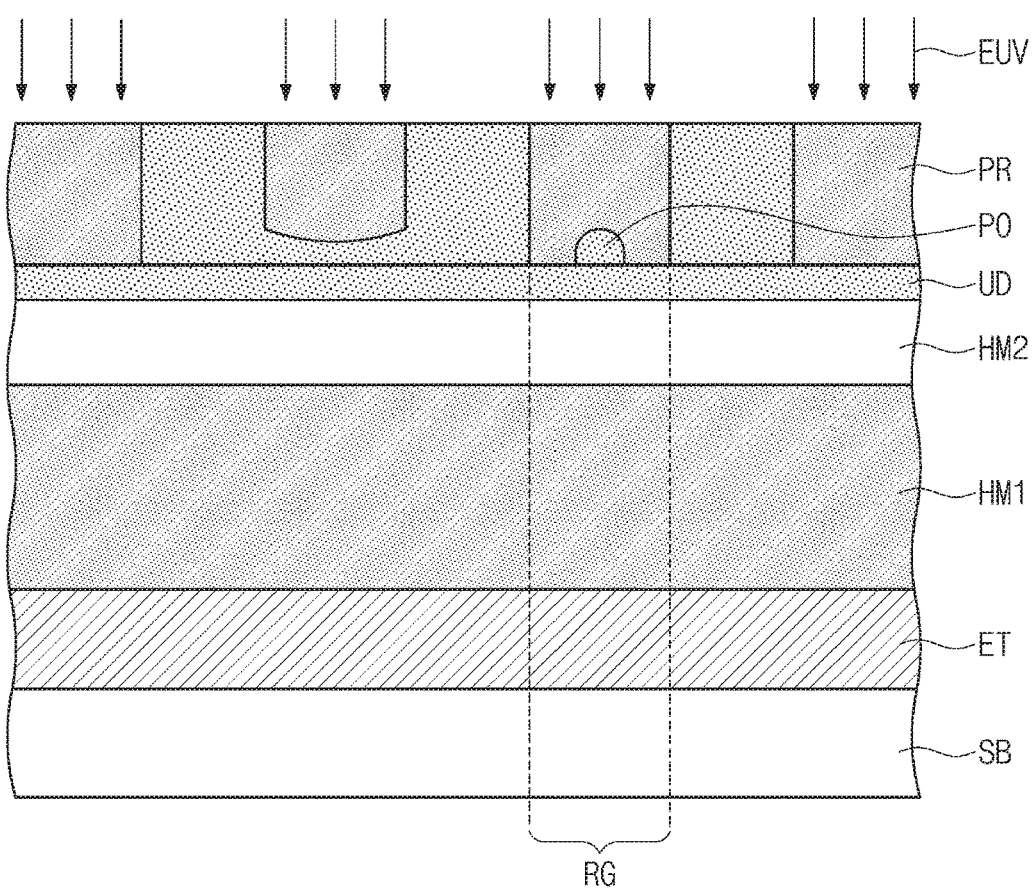

Referring to FIG. 2, a photoresist layer PR may be formed on the under layer UD. The photoresist layer PR may include a photosensitive compound or a synthetic resin that can be exposed and developed with extreme ultraviolet (EUV) radiation.

An exposure process using the EUV radiation may be performed on the photoresist layer PR. For example, the EUV radiation may have a wavelength of about 13.5 nm, and thus fine-pitch patterns may be obtained. According to some example embodiments, since the EUV exposure process is performed at relatively low energy, a portion of the photoresist layer may be likely to insufficiently react with the EUV radiation. For example, the photoresist layer PR may have one or more non-reacted portions PO, which cannot or do not react with the EUV, at one or more regions RG onto which the EUV radiation is irradiated.

Figure 3:
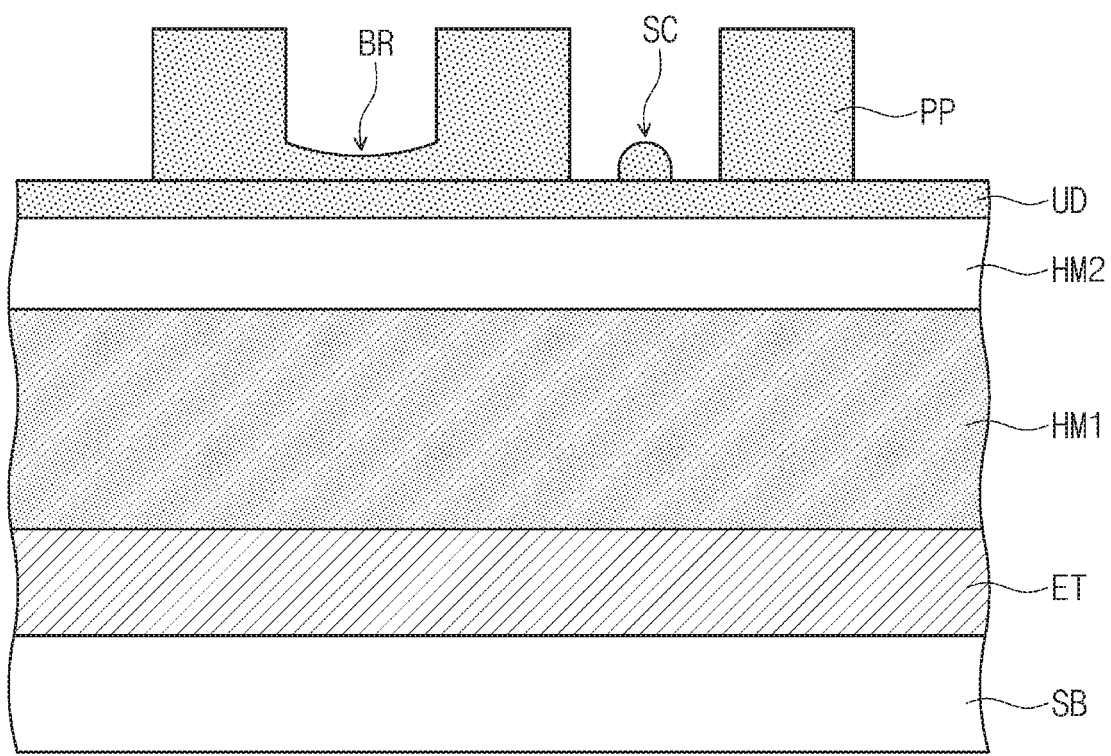

Referring to FIG. 3, photoresist patterns PP may be formed by developing the photoresist layer PR that has been exposed with the EUV radiation. The non-reacted portions PO may be caused to leave a bridge BR between the photoresist patterns PP and/or a scum SC between the photoresist patterns PP. Each of the photoresist patterns PR may have a linear or island shape in a plan view, but inventive concepts are not limited thereto.

Figure 4:
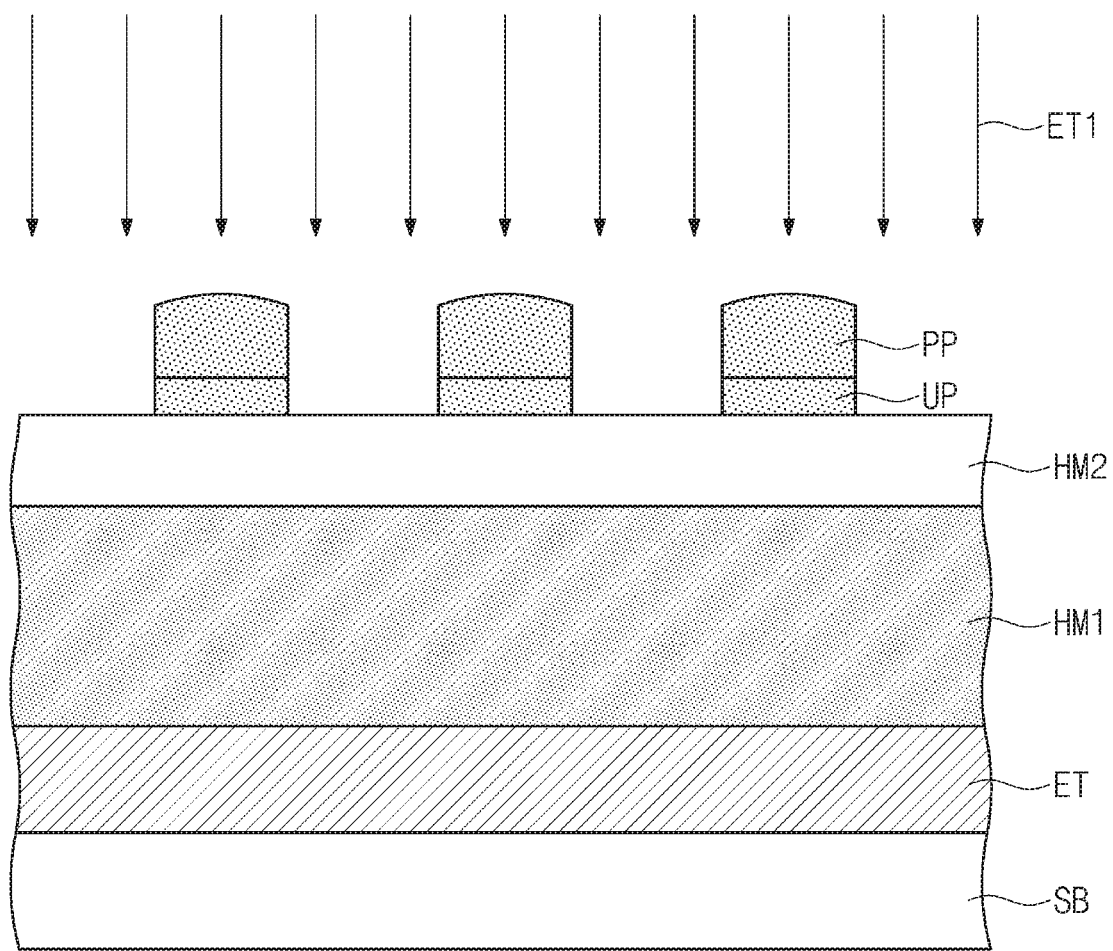

Referring to FIG. 4, under patterns UP may be formed by performing a first etching process ET1 in which the photoresist patterns PP are used as an etching mask. The first etching process ET1 may completely remove the bridge BR and the scum SC that remain between the photoresist patterns PP. The first etching process ET1 may be or include a dry etching process using nitrogen (N2) plasma. When the nitrogen plasma treatment is performed on the photoresist patterns PP, carbon included in the photoresist patterns PP may react with nitrogen to produce carbon nitride. The carbon nitride may be volatilized to remove the remaining bridge BR and scum SC. Since the under layer UD is an organic polymer mainly which includes carbon, the nitrogen plasma treatment may also remove the under layer UD.

The nitrogen plasma treatment may selectively etch the photoresist patterns PP and the under layer UD. The second mask layer HM2 may serve as an etching stop layer during the first etching process ET1. For example, the first etching process ET1 may continue until the second mask layer HM2 is exposed.

According to some example embodiments of inventive concepts, a method of forming a target pattern may use the EUV radiation, and thus an anti-reflection layer required for a typical photolithography process that uses a light source such as ArF may not be used or needed. The EUV radiation may have an extremely short wavelength, and thus not exhibit optical characteristics (e.g., light reflection) present in, for example, an ArF light source. Therefore, according to inventive concepts, an anti-reflection layer may be replaced with the under layer UD whose constituent is analogous to the constituent of the photoresist layer PR. For example, a typical anti-reflection layer may include a silicon oxynitride layer (e.g., SiON), and the anti-reflection layer may not be etched during the first etching process ET1. In contrast, according to inventive concepts, the anti-reflection layer may be replaced with the under layer UD, and thus during the first etching process ET1 the under layer UD may be etched to form the under patterns UP. Since the under patterns UP are fully or normally formed during the first etching process ET1, subsequent etching processes may form target patterns (see EP of FIG. 8) having a uniform shape which will be discussed above.

The first etching process ET1 may be carried out in a plasma chamber. For example, the plasma chamber may use an inductively coupled plasma (ICP) source or a capacitively coupled plasma (CCP) source. During the first etching process ET1, the plasma chamber may maintain at a pressure ranging from about 1 mTorr to about 100 mTorr. Nitrogen introduced into the plasma chamber may have an amount ranging from about 5 sccm to about 1,000 sccm.

Nitrogen, alone or in combination, may be used as a process gas, e.g. an etching gas, of the first etching gas ET1. The gas of the first etching gas ET1 may include, consist essentially of, or consist of nitrogen. During the first etching process ET1, the plasma chamber may be supplied with an inert gas, such as argon, in addition to the process gas including, e.g., consisting of, nitrogen.

Figure 5:
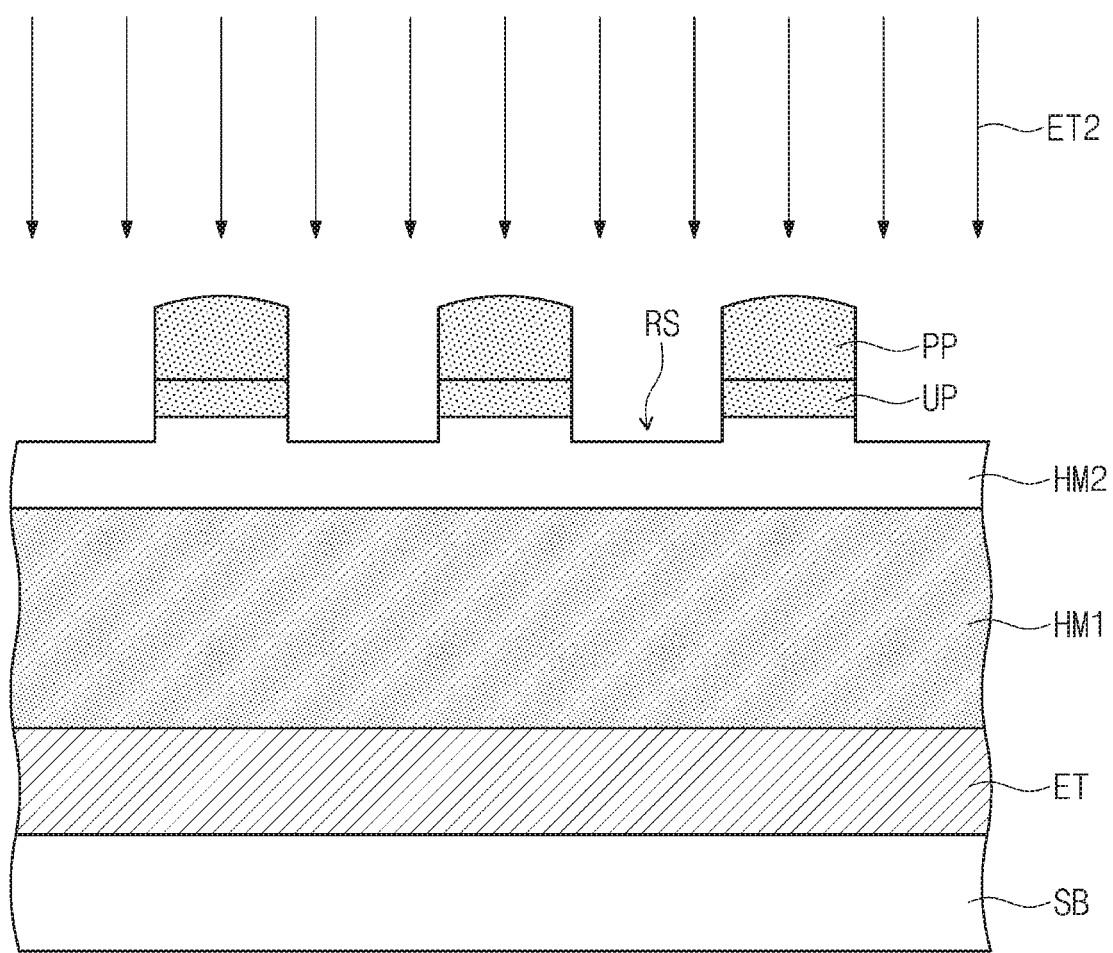

Referring to FIG. 5, the photoresist patterns PP and the under patterns UP may be used as an etching mask to etch an upper portion of the second mask layer HM2, which step may form recessions RS on the upper portion of the second mask layer HM2. A second etching process ET2 may be performed to etch the upper portion of the second mask layer HM2.

The second etching process ET2 may partially etch the upper portion of the second mask layer HM2. Therefore, even after the second etching process ET is completed, the first mask layer HM1 may not be exposed. The second etching process ET2 may be or include a plasma dry etching process. An etching gas of the second etching process ET2 may include a CHF-based etching material (e.g., CHF3, CH2F2, CH3F, CH4, C4F6, and/or C4F8).

Figure 6:
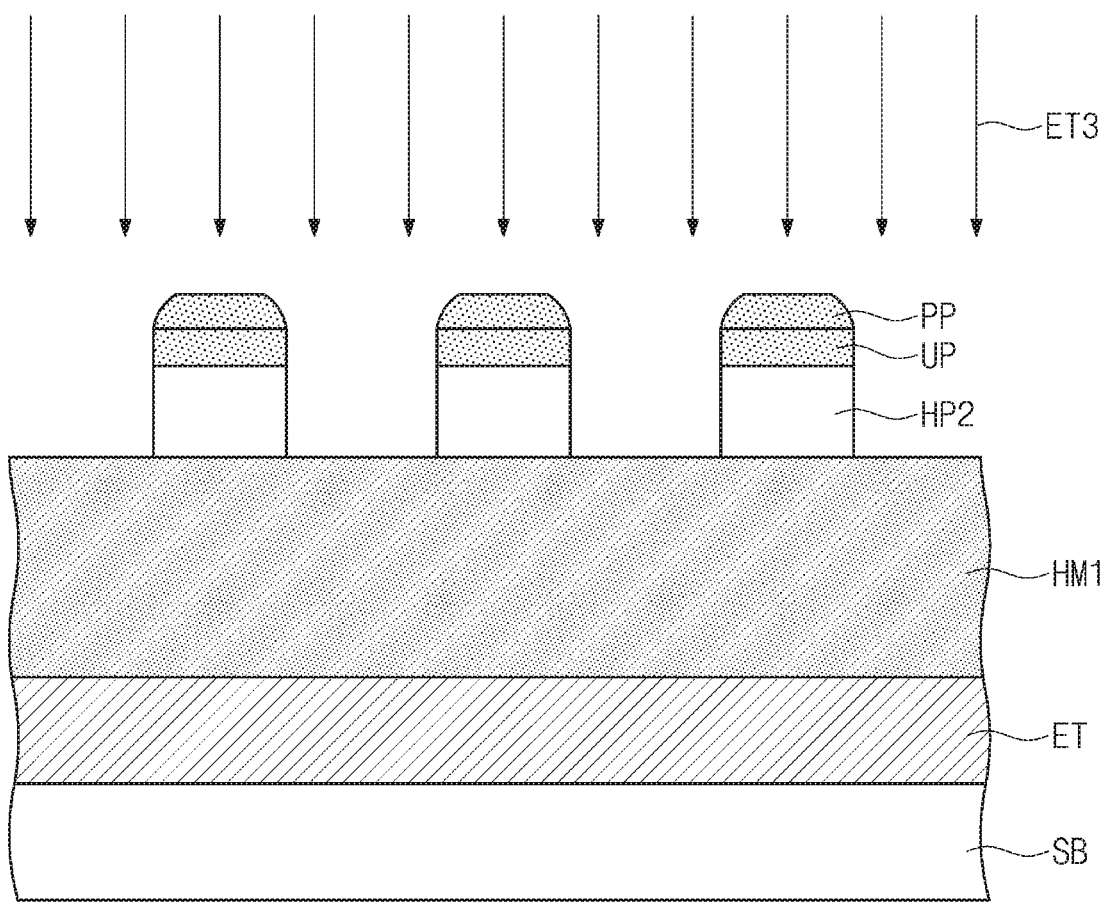

Referring to FIG. 6, the photoresist patterns PP and the under patterns UP may be used as an etching mask to etch the second mask layer HM2, which step may form second mask patterns HP2. A third etching process ET3 may be performed to etch the second mask layer HM2. The third etching process ET3 may be or include a plasma dry etching process. An etching gas of the third etching process ET3 may include at least one selected from a group consisting of SF6, HBr, and BCl3. The etching gas of the third etching process ET3 may further include oxygen (O2).

In an example embodiment, no second etching process ET2 may be performed. In another example embodiment, the second and third etching processes ET2 and ET3 may be sequentially performed in a single chamber.

Figure 7:
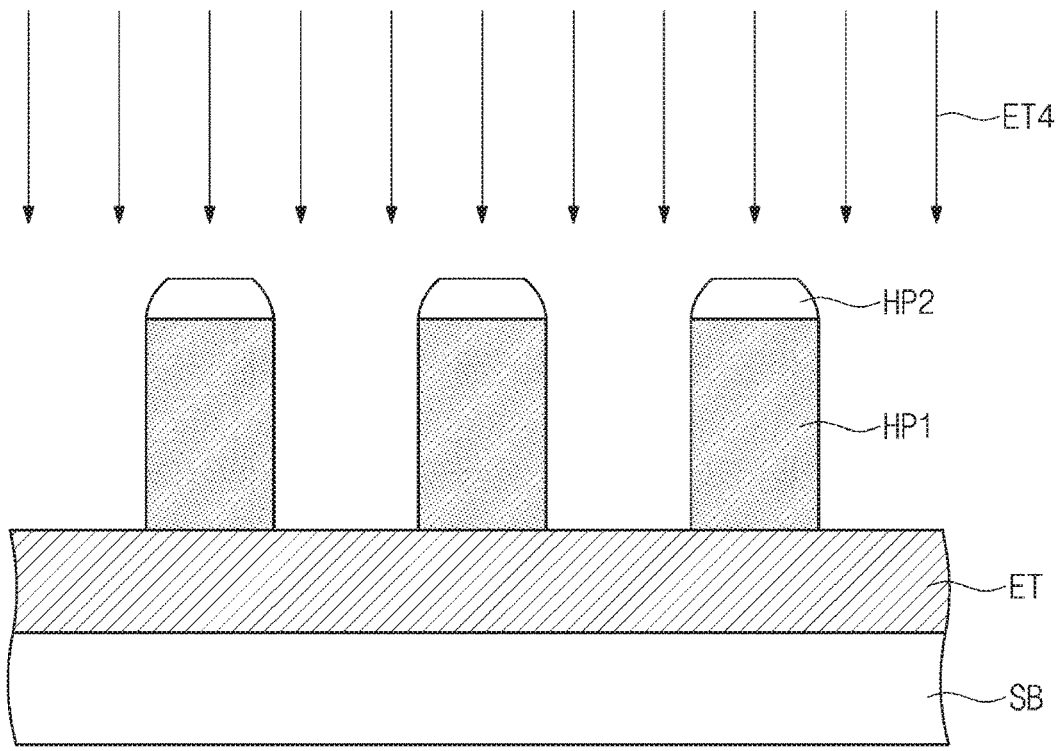

Referring to FIG. 7, the second mask patterns HP2 may be used as an etching mask to etch the first mask layer HM1, which step may form first mask patterns HP1. A fourth etching process ET4 may be performed to etch the first mask layer HM1. For example, before the fourth etching process ET4 is performed, remaining photoresist patterns PR and remaining under patterns UP may be selectively removed. Alternatively, the remaining photoresist patterns PR and the remaining under patterns UP may be completely removed during the fourth etching process ET4.

The fourth etching process ET4 may be or include a dry etching process. The fourth etching process ET4 may use an etching gas that can selectively etch the first mask layer HM1. When the second mask patterns HP2 include a silicon-based layer or a metal layer, the etching gas may exhibit high etch selectivity to the first mask layer HM1 including a carbon-containing organic material. Therefore, the second mask patterns HP2 may remain as an etching mask without significantly being removed during the fourth etching process ET4.

Figure 8:
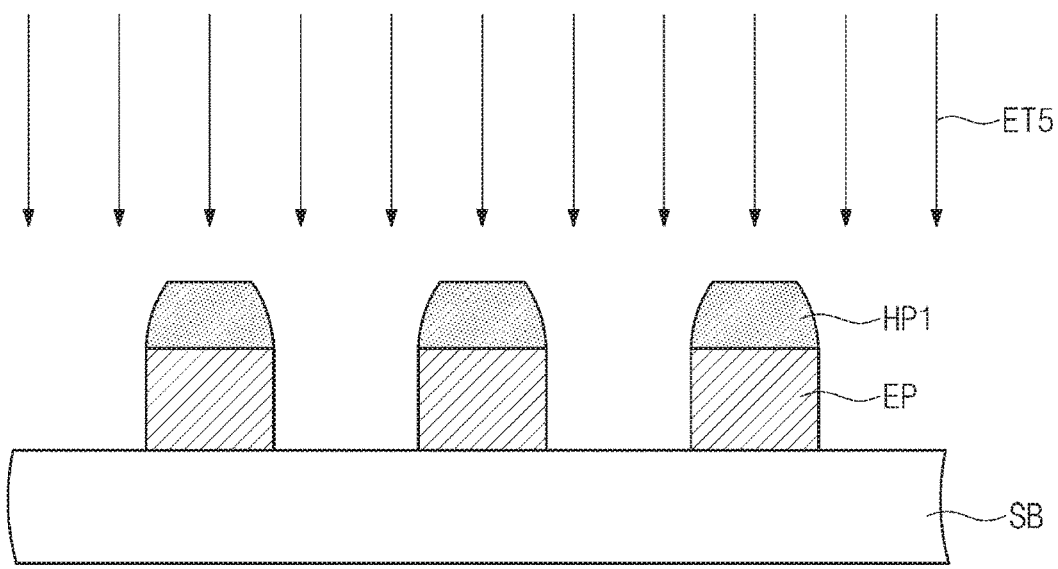

Referring to FIG. 8, the first mask patterns HP1 may be used as an etching mask to etch the etching target layer ET, which step may form target patterns EP. For example, a fifth etching process ET5 may be performed to etch the etching target layer ET. Before the fifth etching process ET5 is performed, remaining second mask patterns HP2 may be selectively removed. Alternatively, the remaining second mask patterns HP2 may be completely removed during the fifth etching process ET5.

According to some example embodiments of inventive concepts, a method of forming a target pattern may employ the exposure process in which extreme ultraviolet (EUV) radiation is used, and therefore the bridge BR and/or the scum SC may remain between the photoresist patterns PP. However, the first etching process ET1 according to inventive concepts may effectively and completely remove the bridge BR and the scum SC. As a result, the target patterns EP may be eventually formed to have desired shapes on intended positions.

FIGS. 9 and 10 show a comparative example in which the first etching process ET1 discussed above with reference to FIG. 4 is not performed.

Referring to FIG. 9, the under patterns UP may be formed by the second etching process ET2 performed on a resultant structure of FIG. 3. The second etching process ET2 may be same as that discussed above with reference to FIG. 5. An upper portion of the second mask layer HM2 may be over-etched during the second etching process ET2. However, the second mask layer HM2 may not be etched on its upper portion below the bridge BR remaining between the photoresist patterns PP. The second mask layer HM2 may also not be etched on its upper portion below the scum SC remaining between the photoresist patterns PP. As a result, the upper portion of the second mask layer HM2 may have an irregular surface profile caused by the bridge BR and the scum SC.

Referring to FIG. 10, the photoresist patterns PP and the under patterns UP may be used as an etching mask to etch the second mask layer HM2, which may form the second mask patterns HP2. The third etching process ET3 may be performed to etch the second mask layer HM2. The third etching process ET3 may be same as that discussed above with reference to FIG. 6.

Since the second mask layer HM2 has the irregular surface profile on its upper portion, the third etching process ET3 may continue for a sufficiently long time until the first mask layer HM1 is exposed. Each of the second mask patterns HP2 may have on its lower portion an undercut UC caused by an over-etching resulting from the relatively long continuation of the third etching process ET3.

When the second mask patterns HP2 including the undercuts UC are used as an etching mask during the fourth and fifth etching processes ET4 and ET5 discussed above, the target patterns EP may be finally formed to have undesired shapes.

Figure 11A:
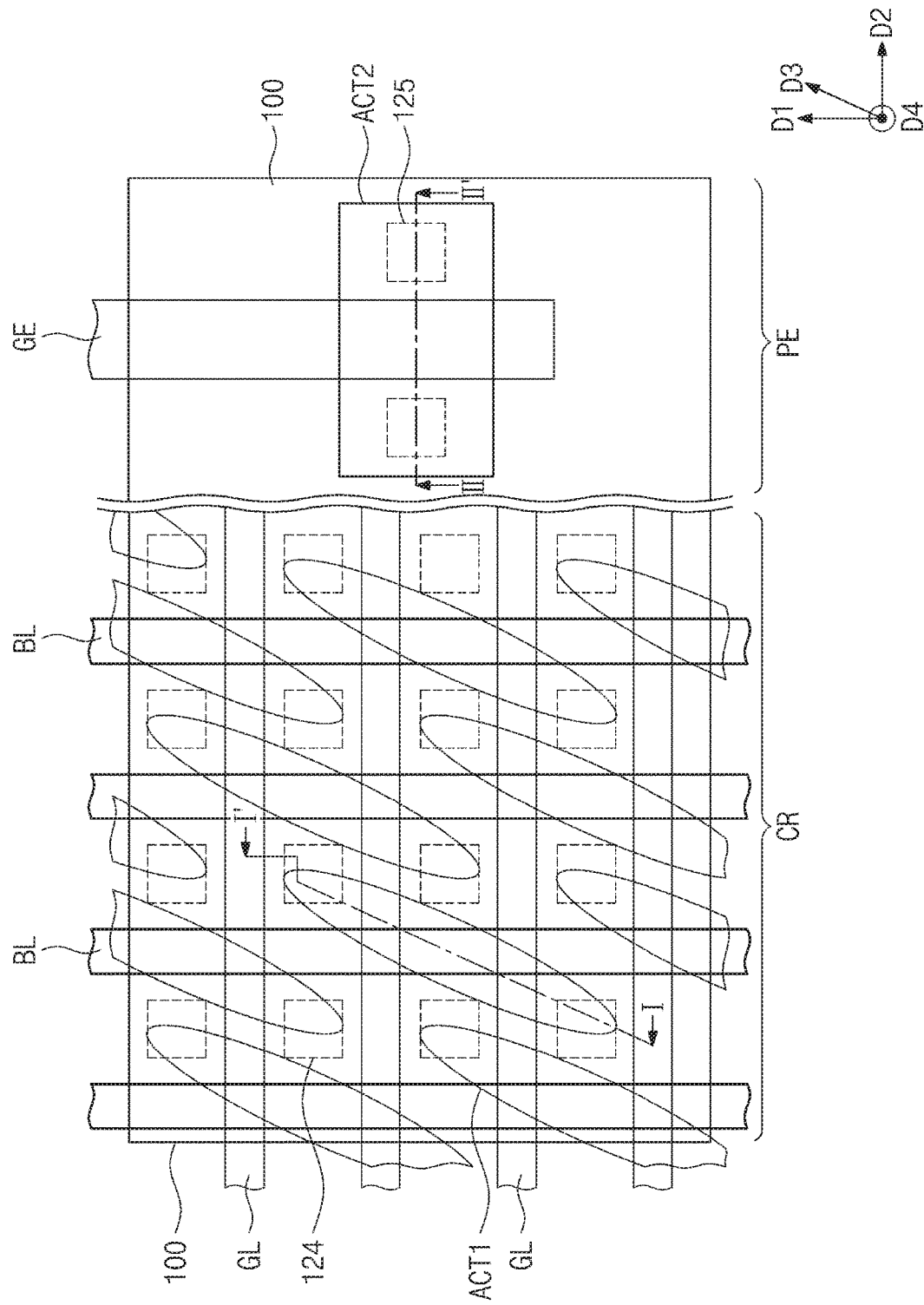
FIGS. 11A, 12A, and 13A illustrate plan views showing a method of manufacturing a semiconductor device according to some example embodiments of inventive concepts.
Figure 11B:
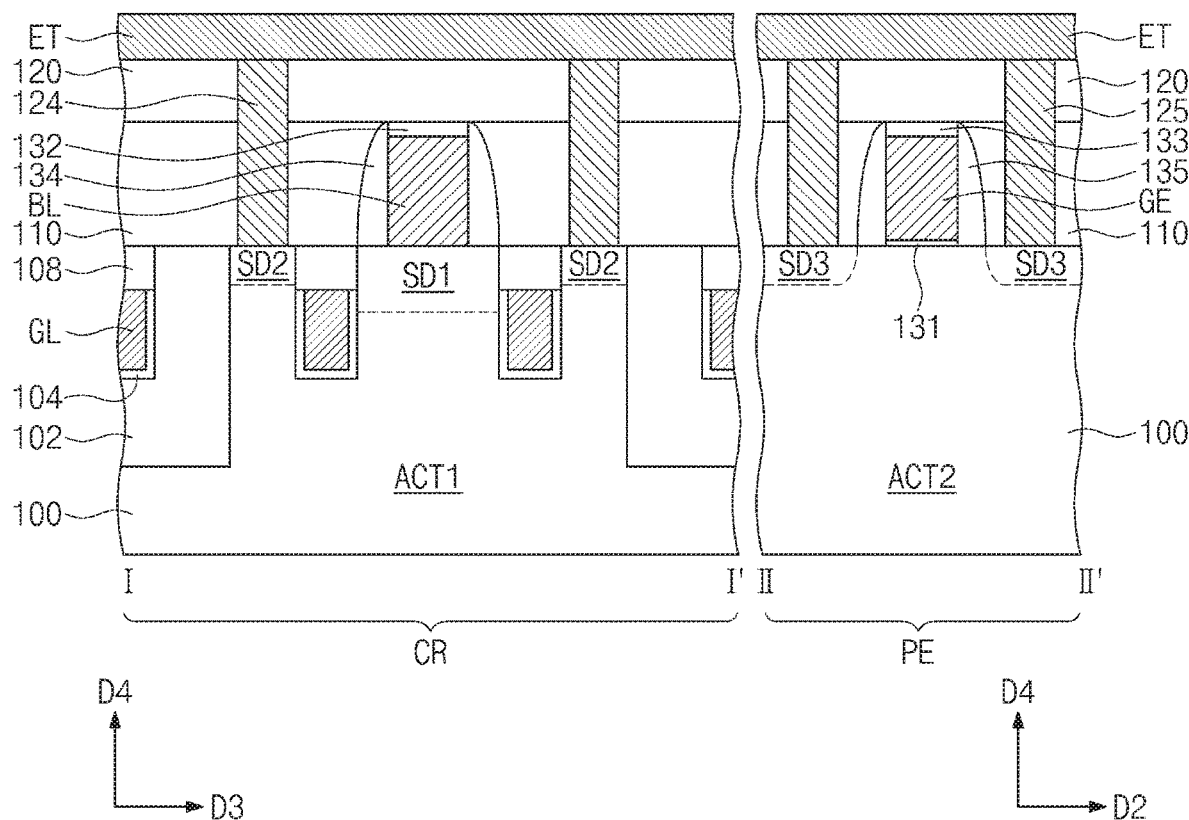
FIGS. 11B, 12B, and 13B illustrate cross-sectional views taken along lines I-I' and II-II' of FIGS. 11A, 12A, and 13A, respectively.
Figure 12A:
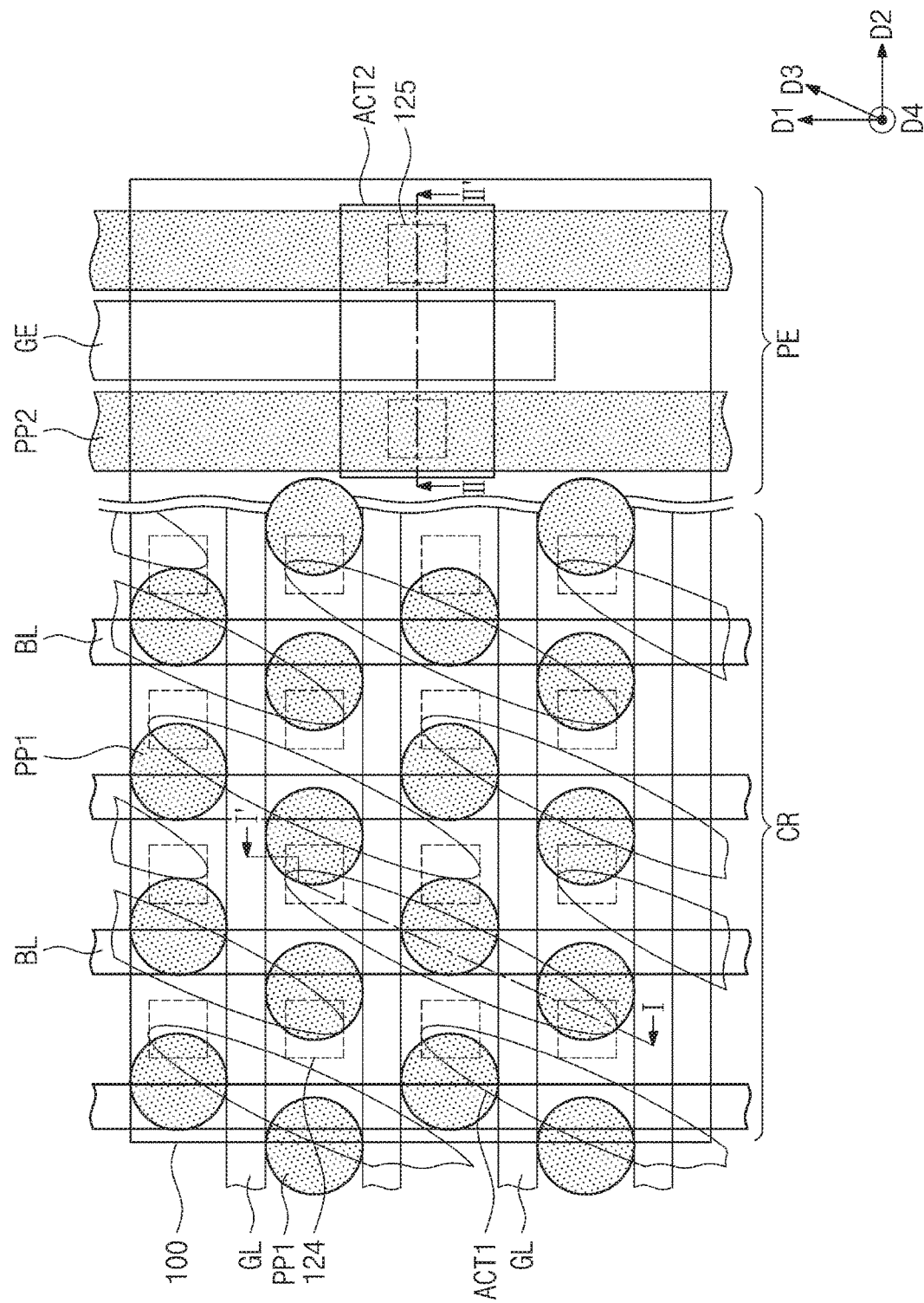
Figure 12B:
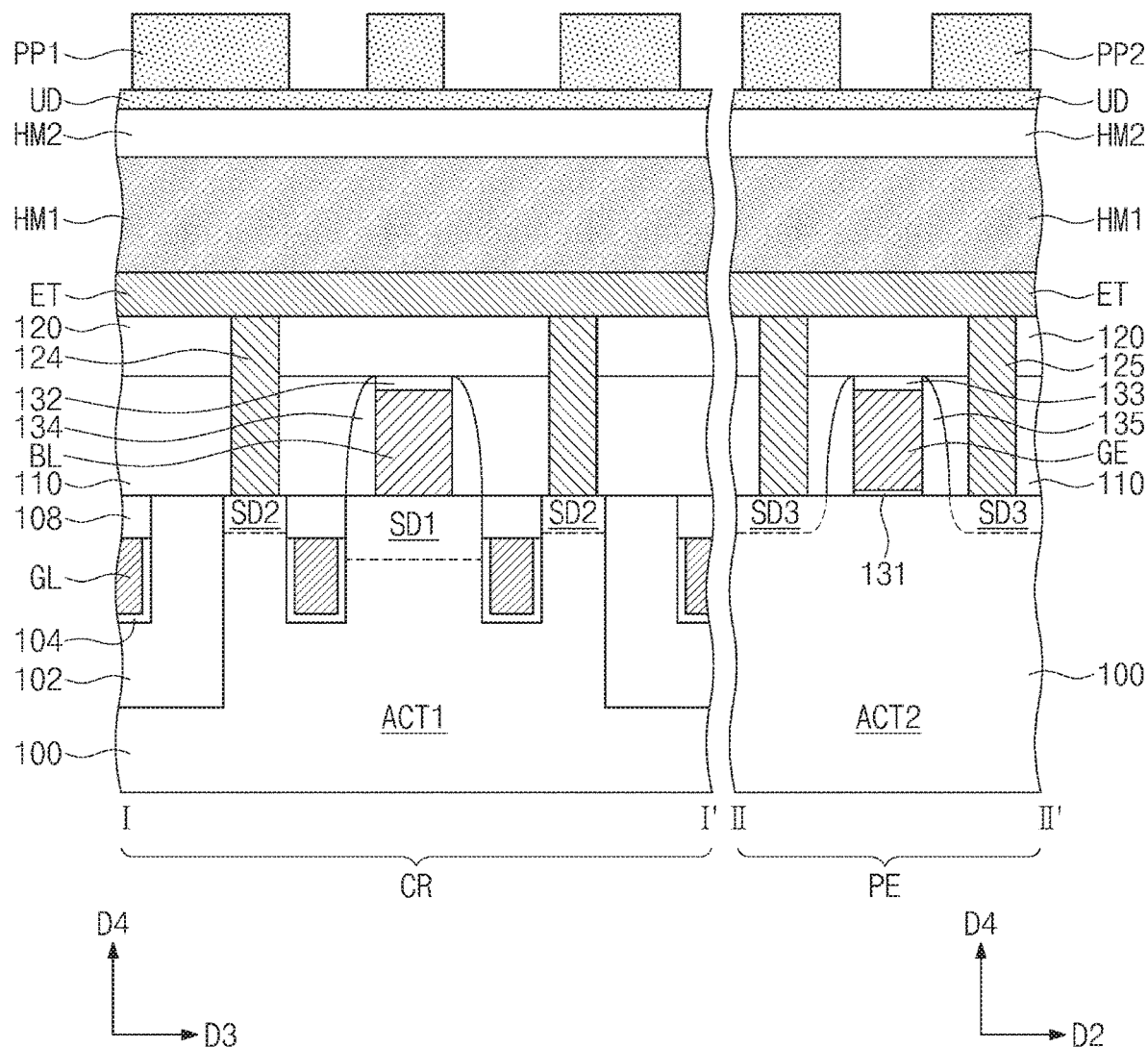
Figure 13A:
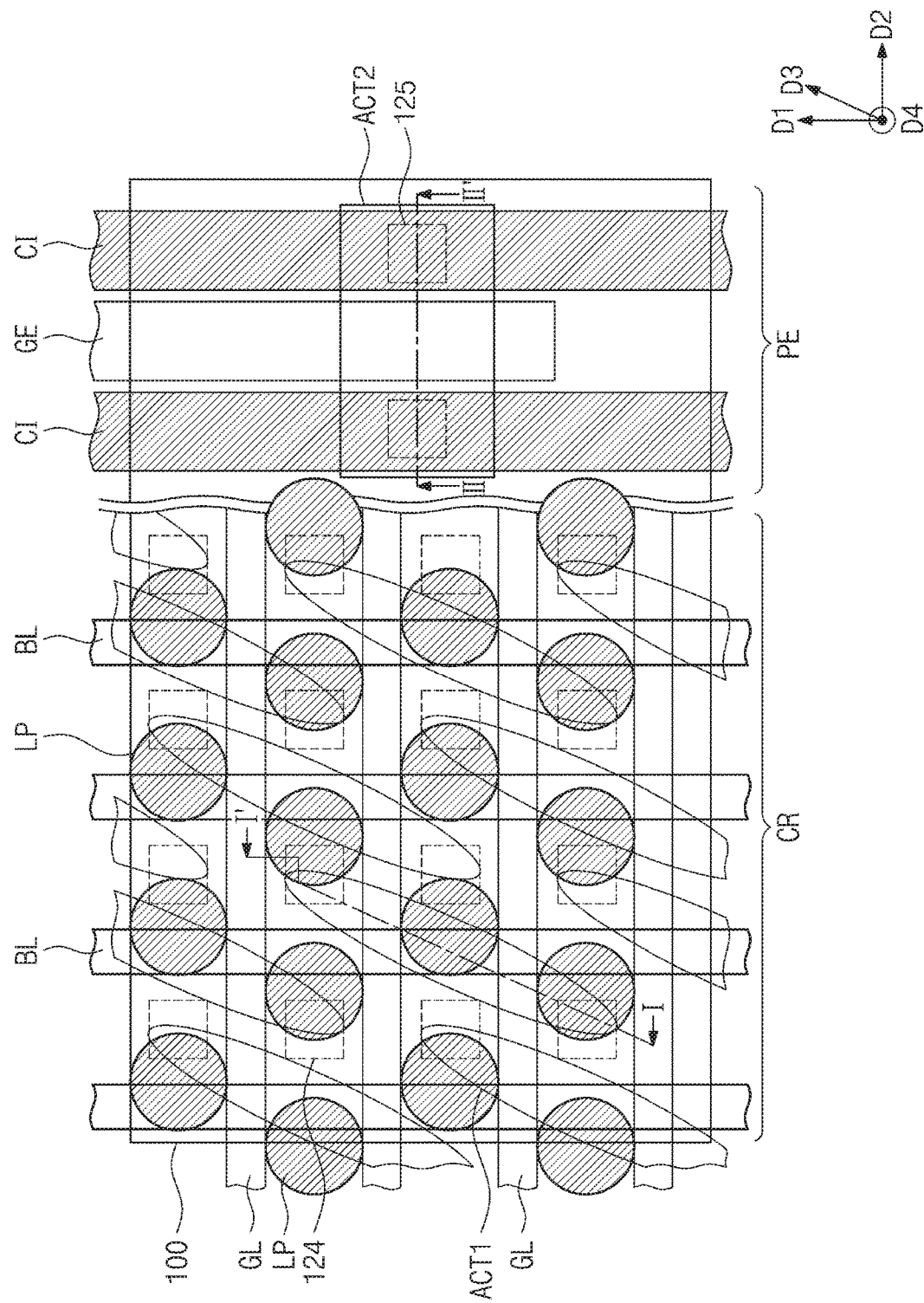
Figure 13B:
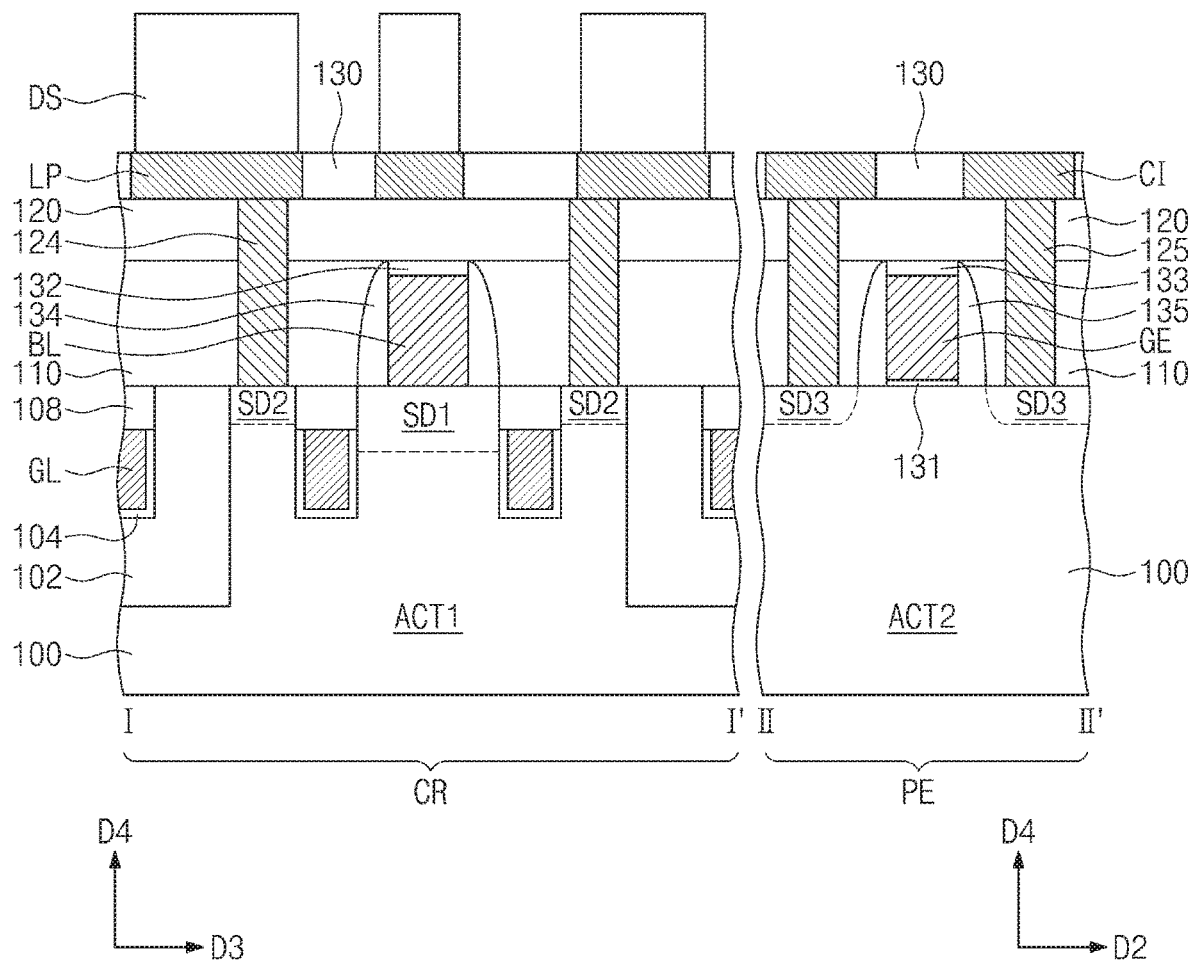
Figure 14A:
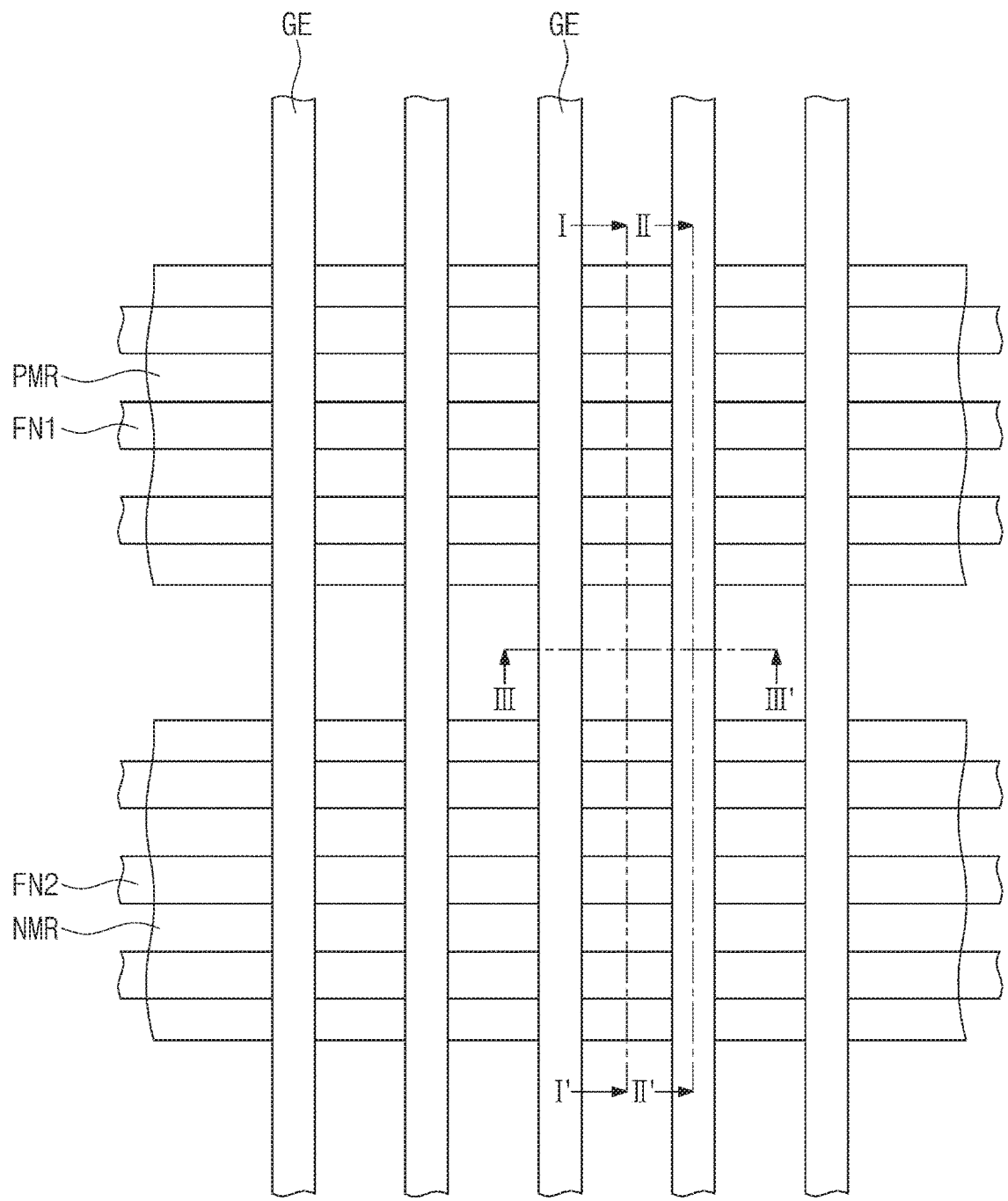
FIGS. 14A, 15A, 16A, 17A, and 18A illustrate plan views showing a method of manufacturing a semiconductor device according to some example embodiments of inventive concepts.
Figure 14A:
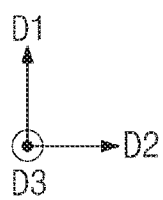
Figure 14B:
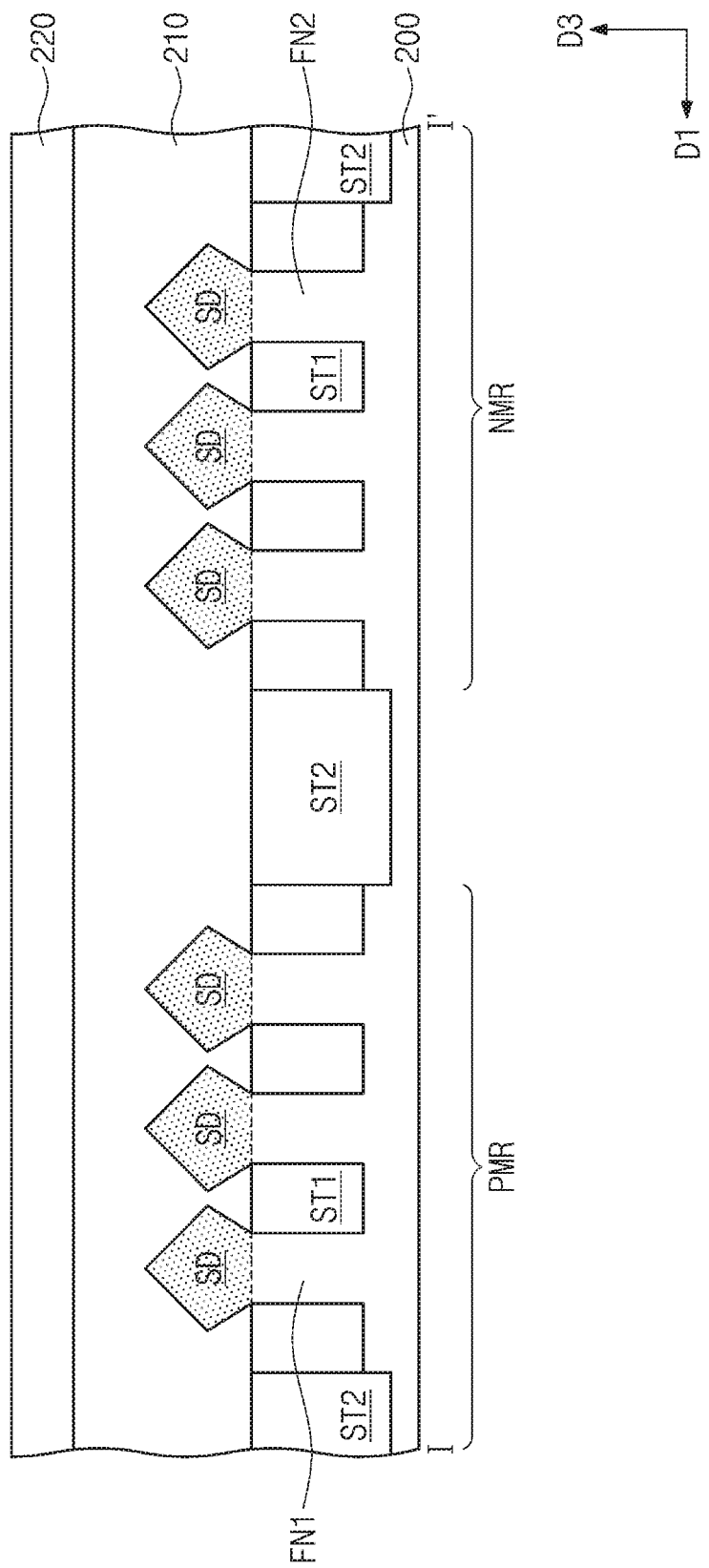
FIGS. 14B, 15B, 16B, 17B, and 18B illustrate cross-sectional views taken along line I-I' of FIGS. 14A, 15A, 16A, 17A, and 18A, respectively.
Figure 14C:
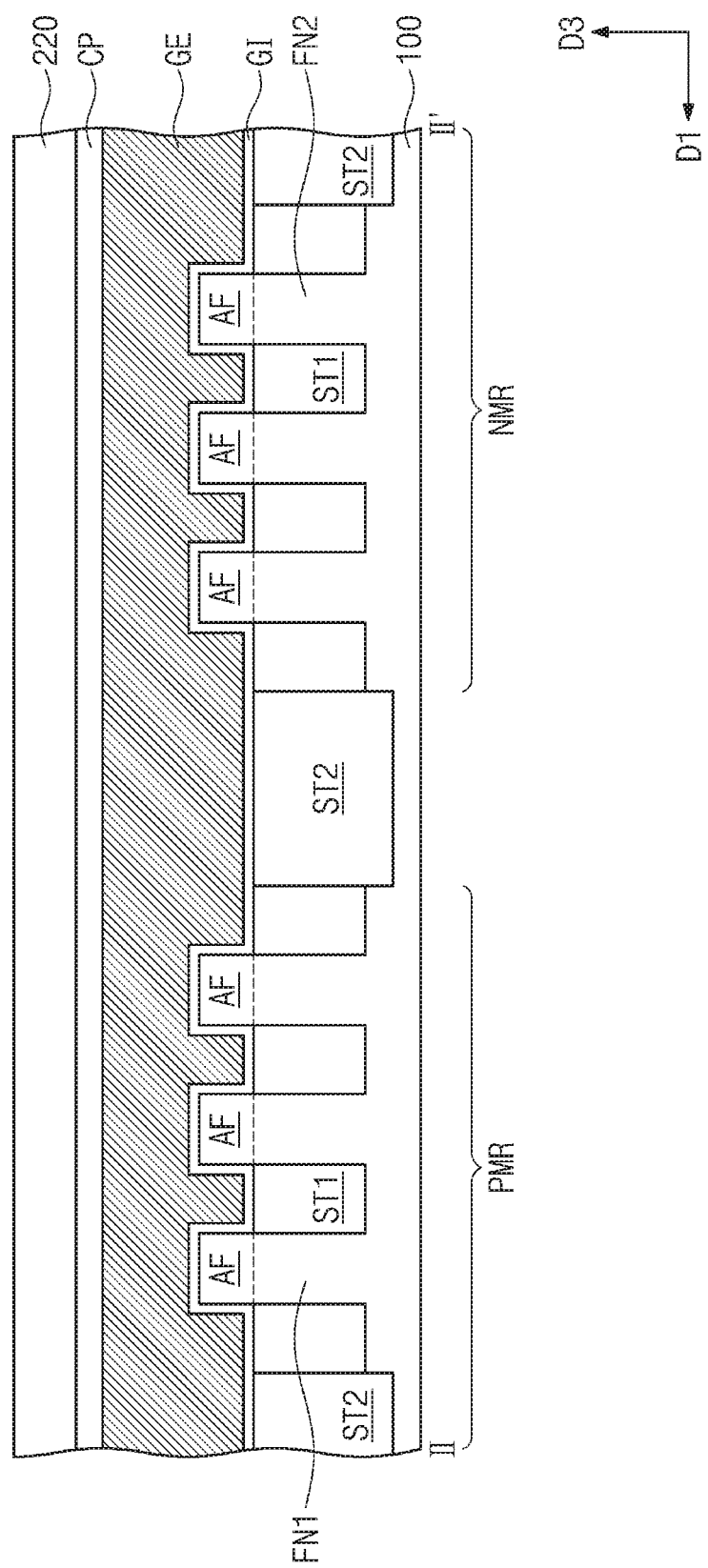
FIGS. 14C, 15C, 16C, 17C, and 18C illustrate cross-sectional views taken along line II-II' of FIGS. 14A, 15A, 16A, 17A, and 18A, respectively.
Figure 14D:
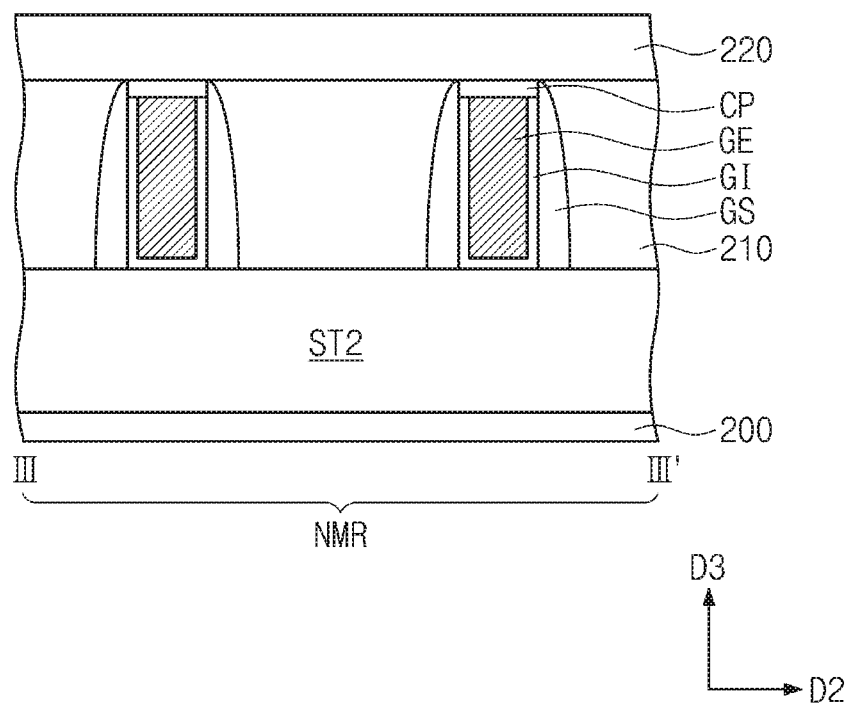
FIGS. 14D, 15D, 16D, 17D, and 18D illustrate cross-sectional views taken along line III-III' of FIGS. 14A, 15A, 16A, 17A, and 18A, respectively.
Figure 15A:
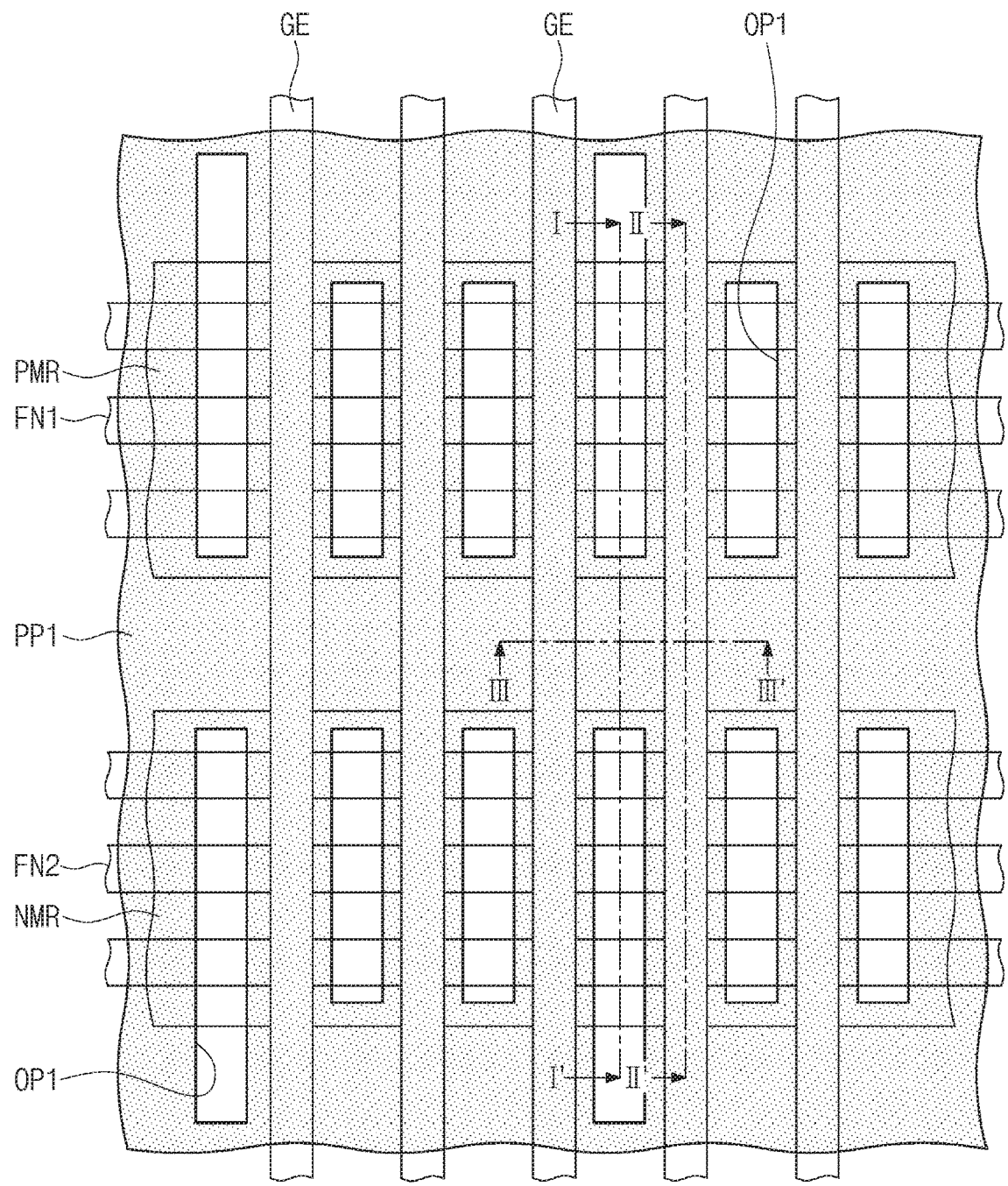
Figure 15A:
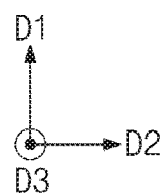
Figure 15B:
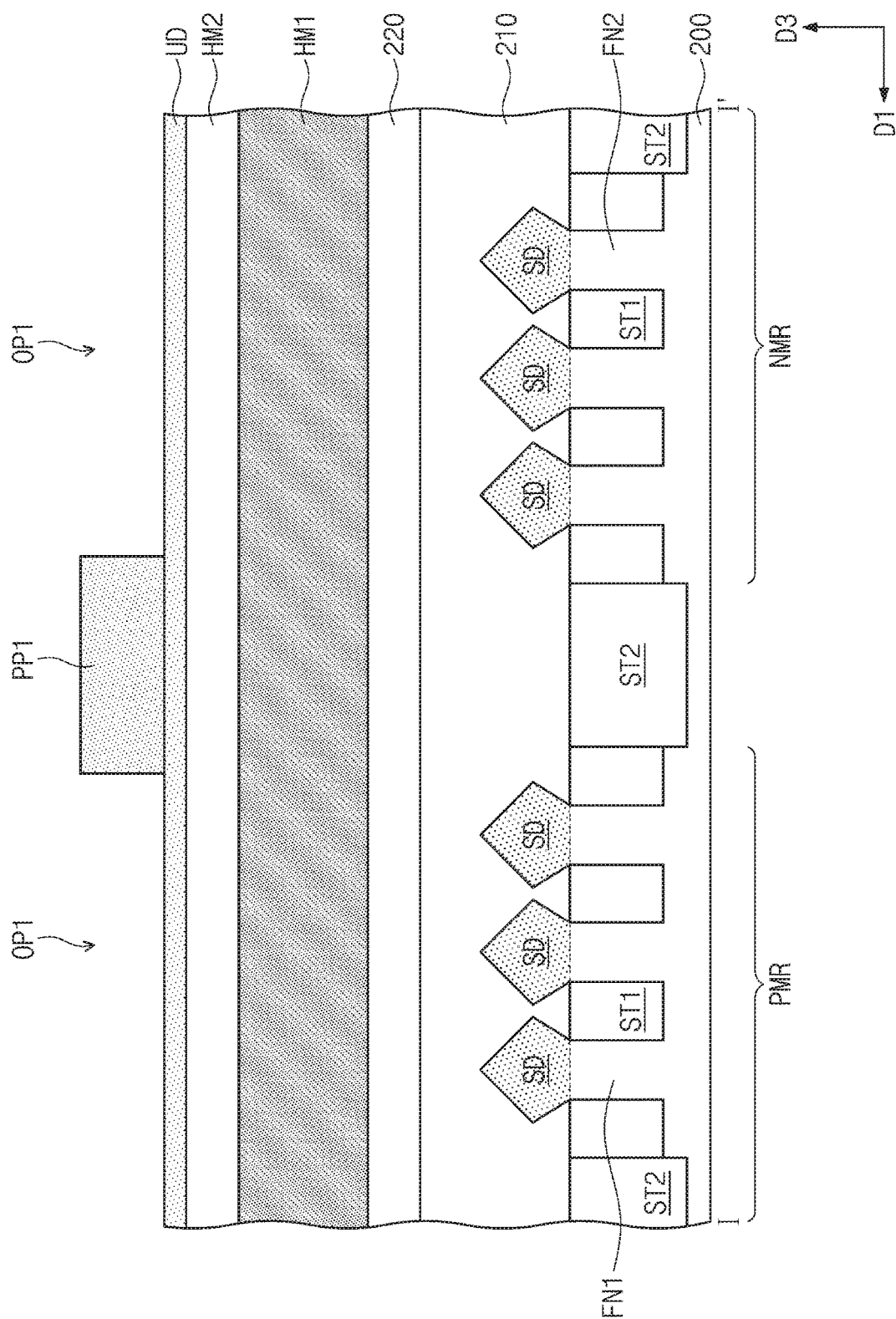
Figure 15C:
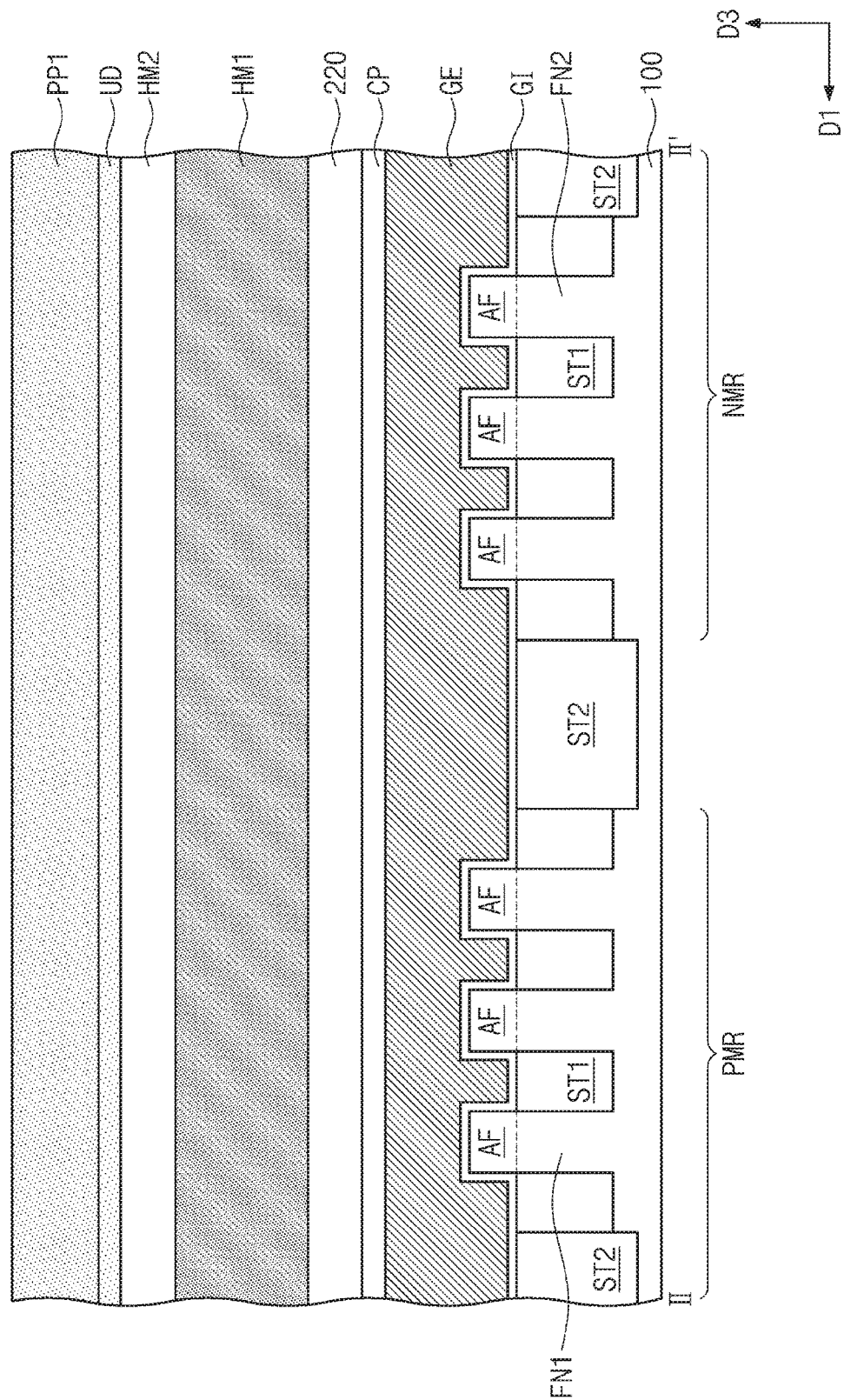
Figure 15D:
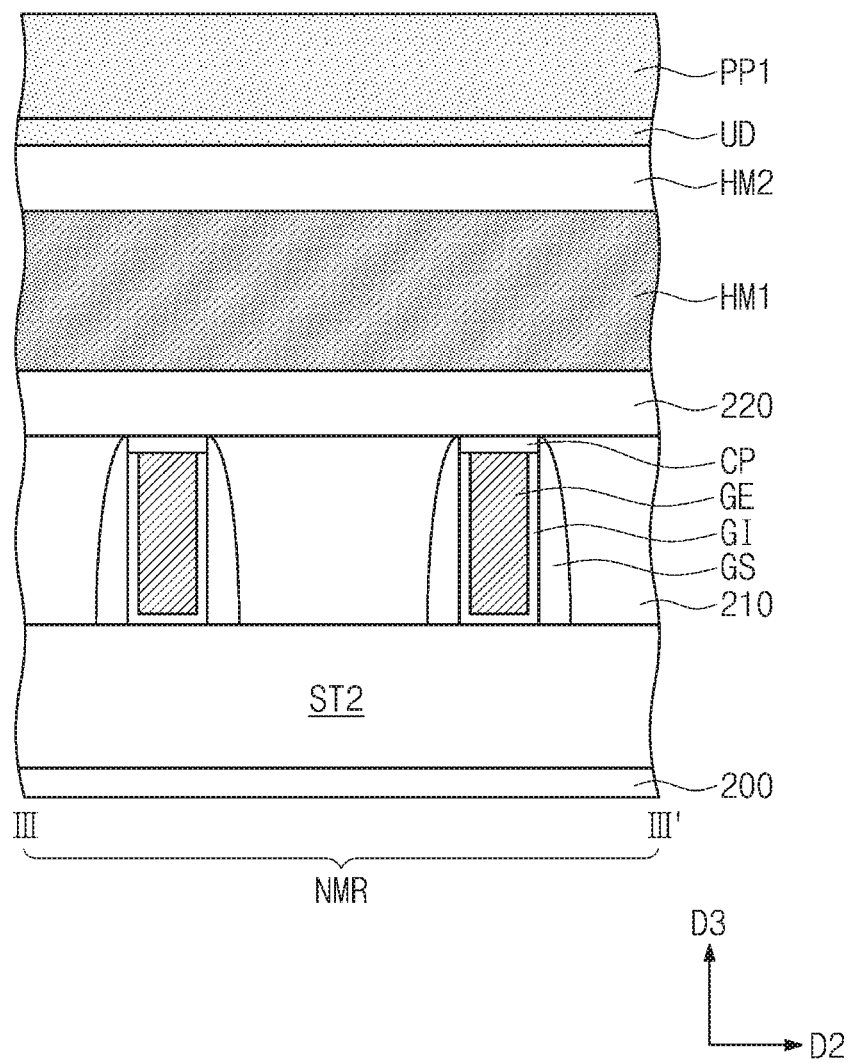
Figure 16A:
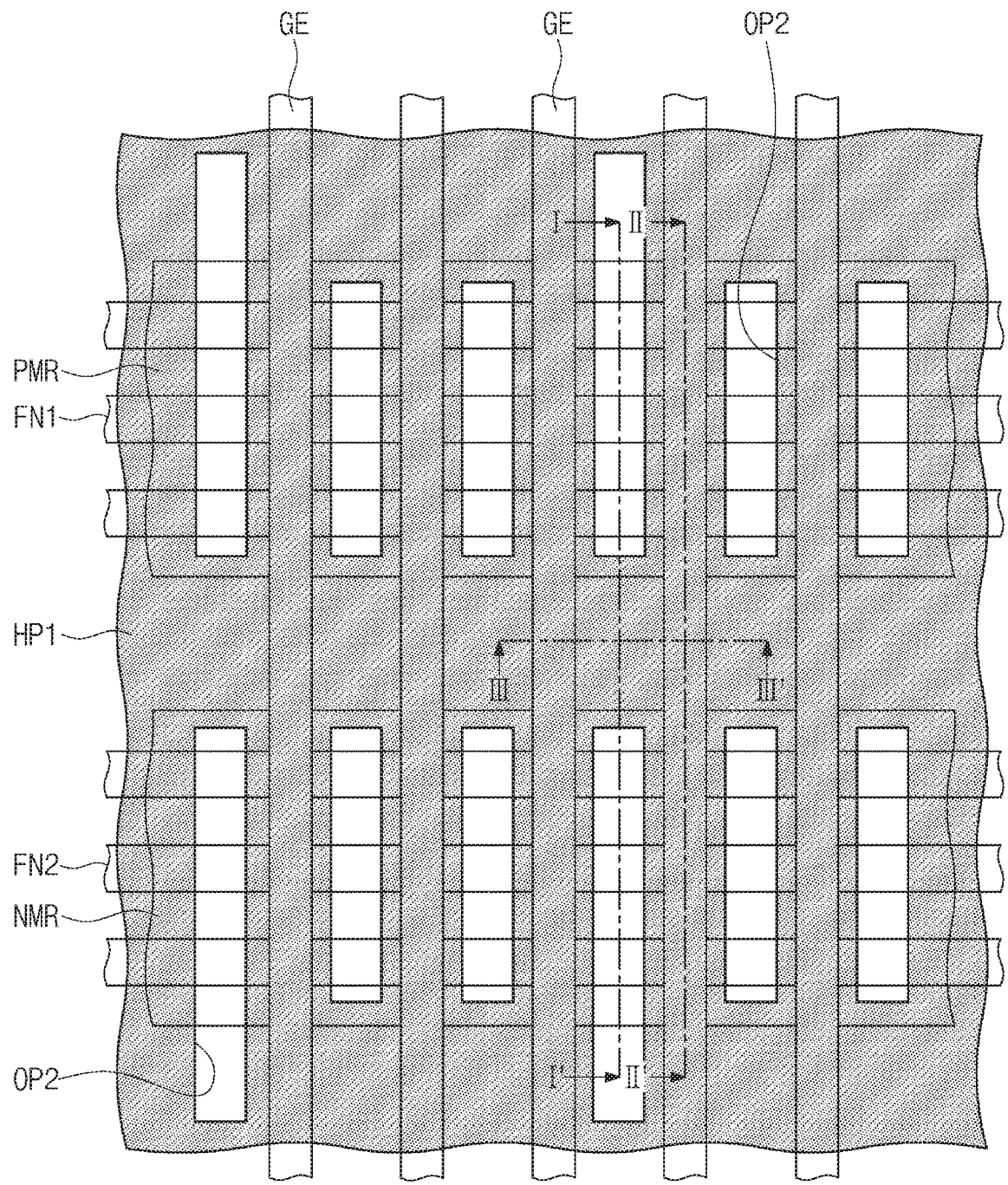
Figure 16A:
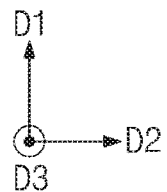
Figure 16B:
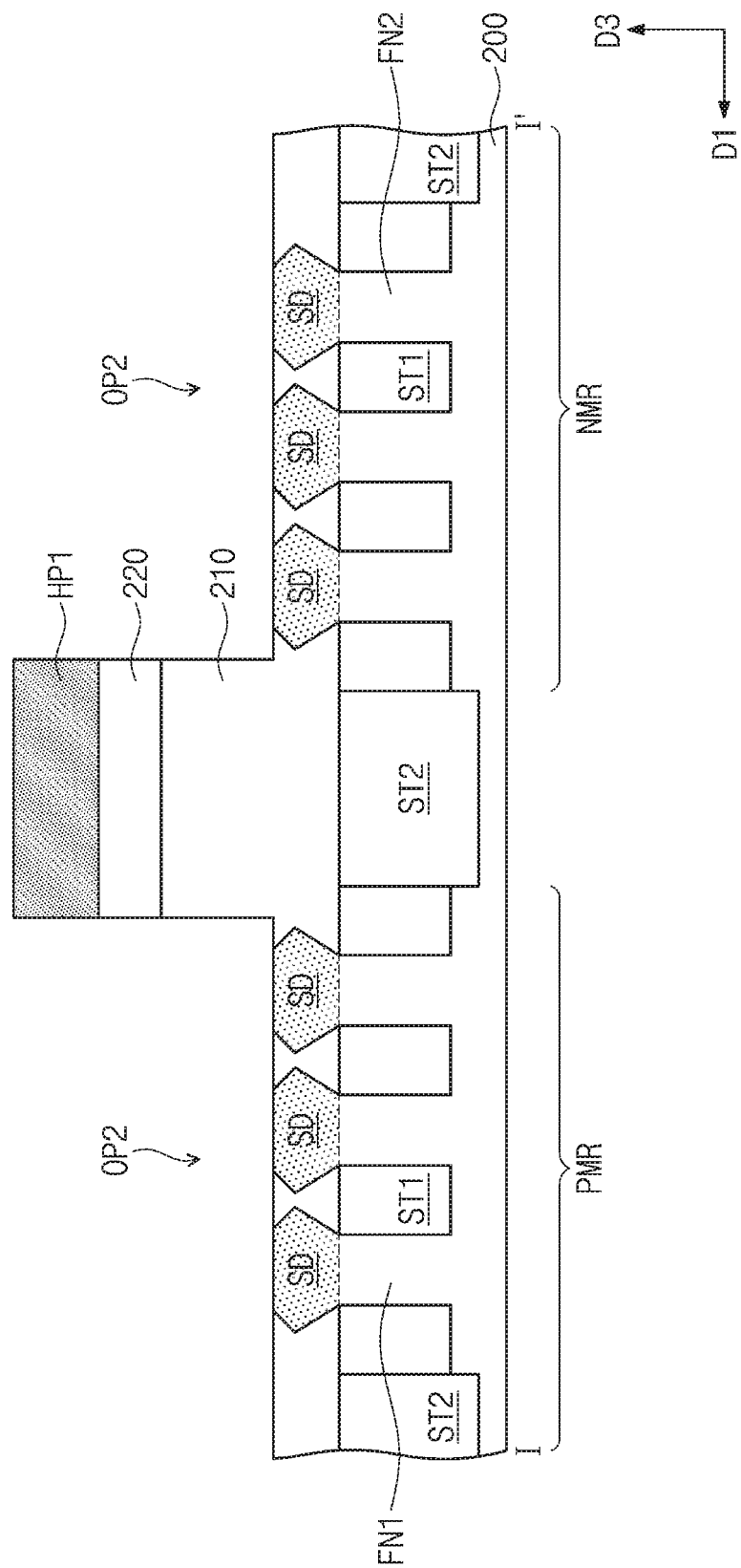
Figure 16C:
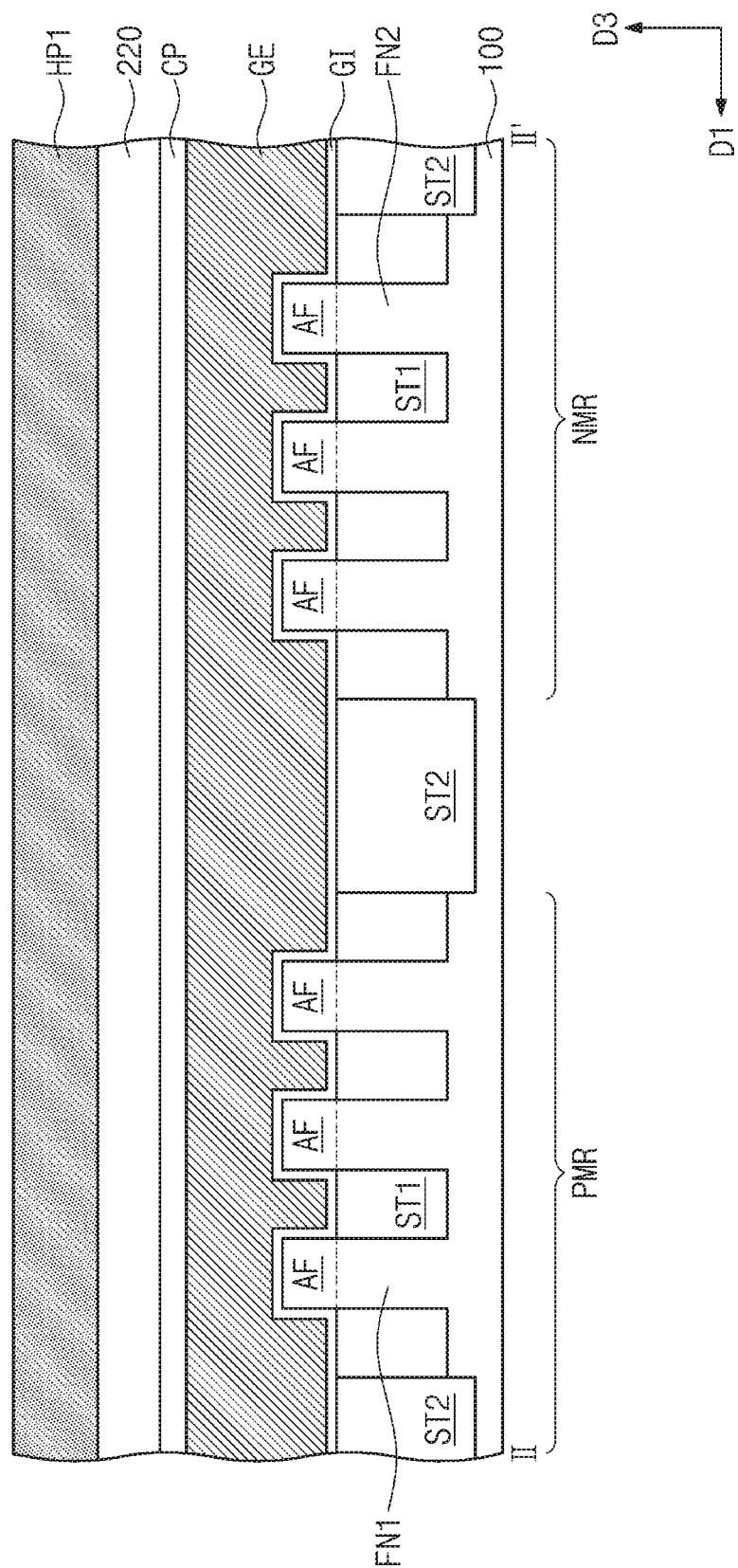
Figure 16D:
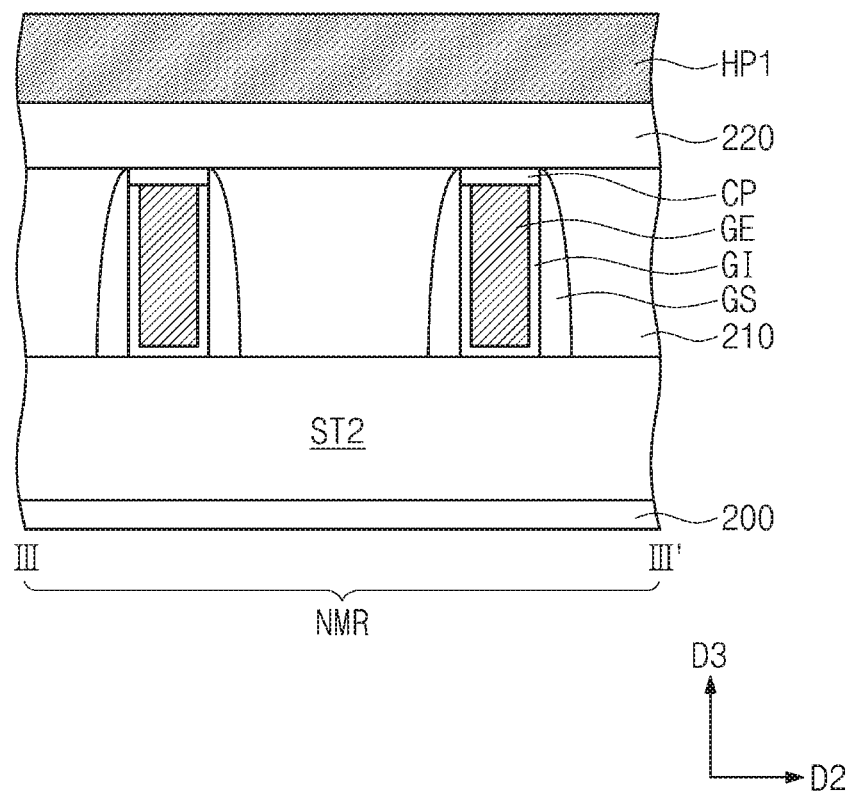
Figure 17A:
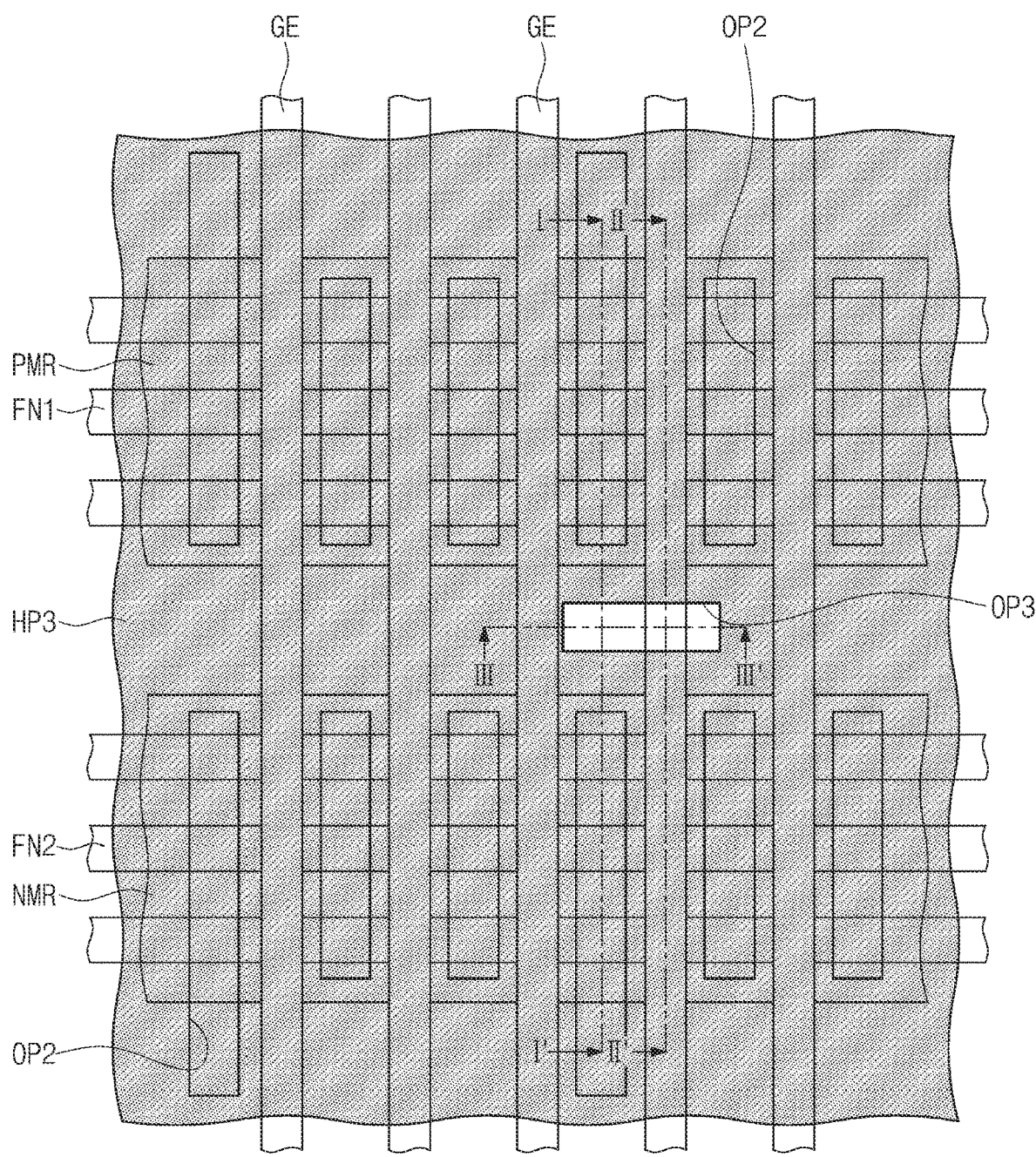
Figure 17A:
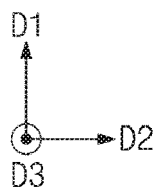
Figure 17B:
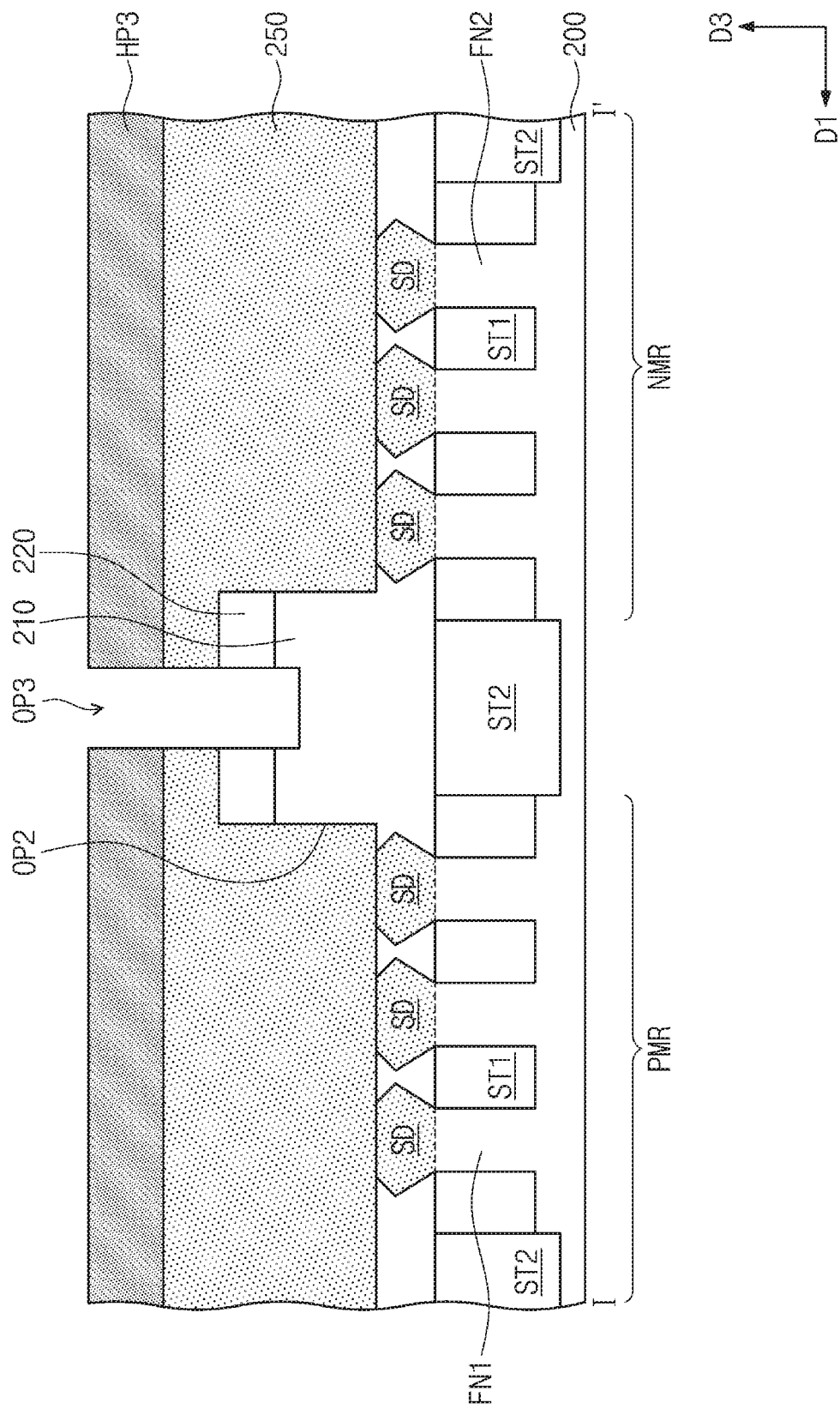
Figure 17C:
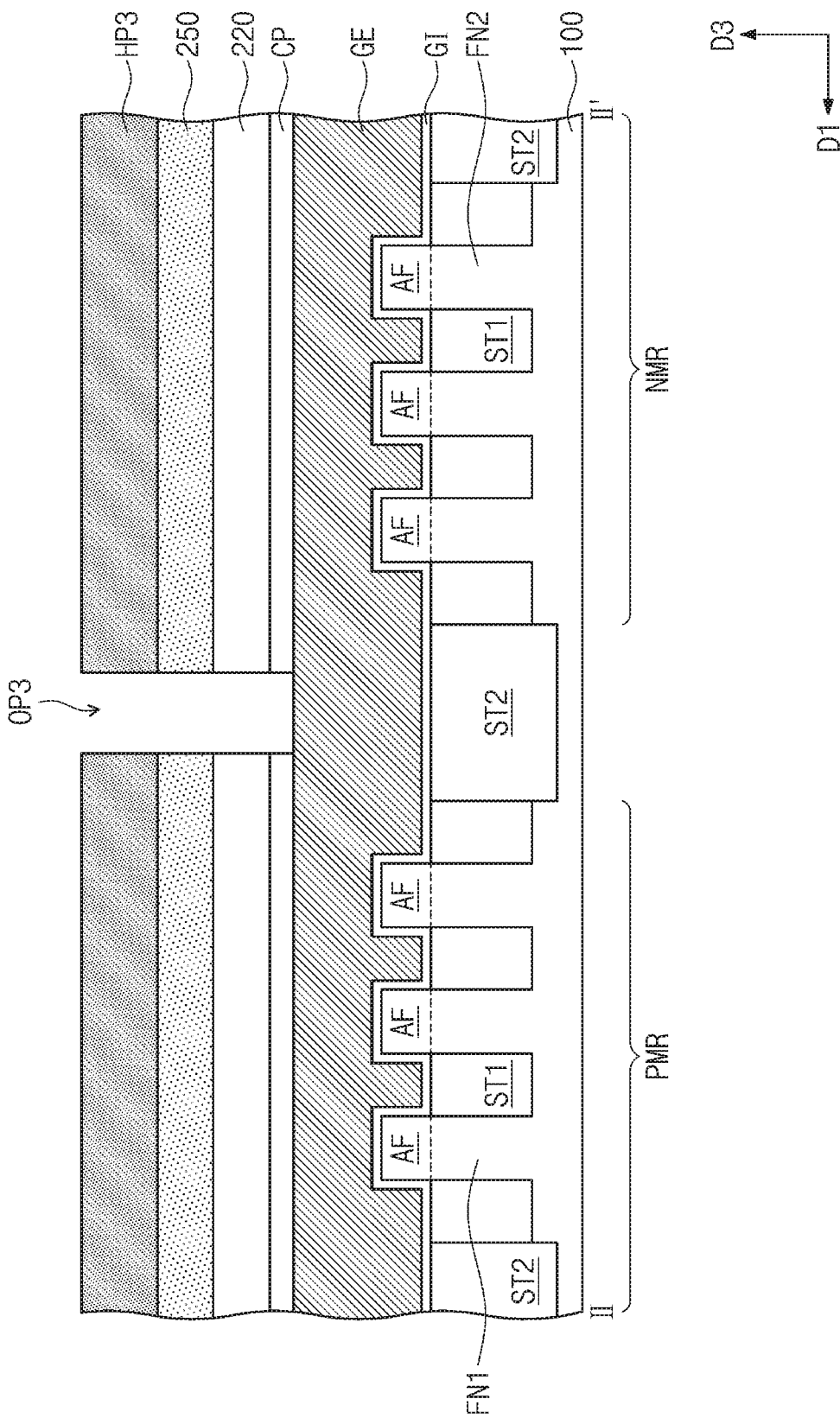
Figure 17D:
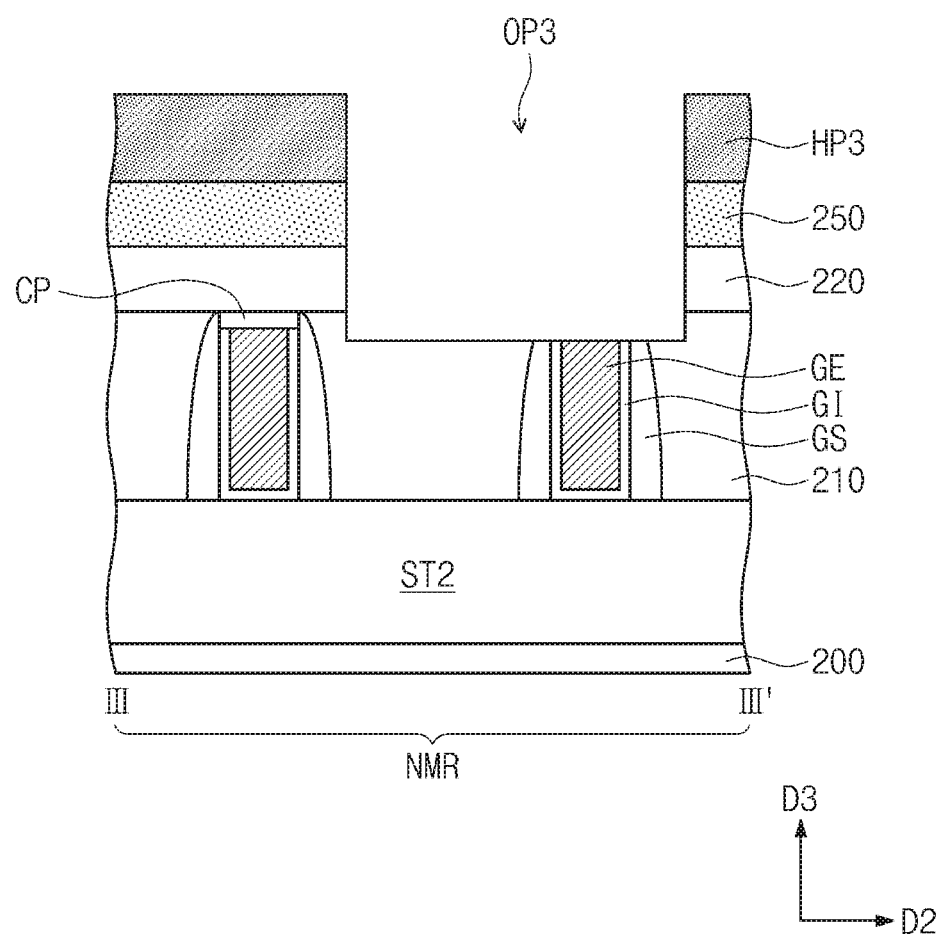
Figure 18A:
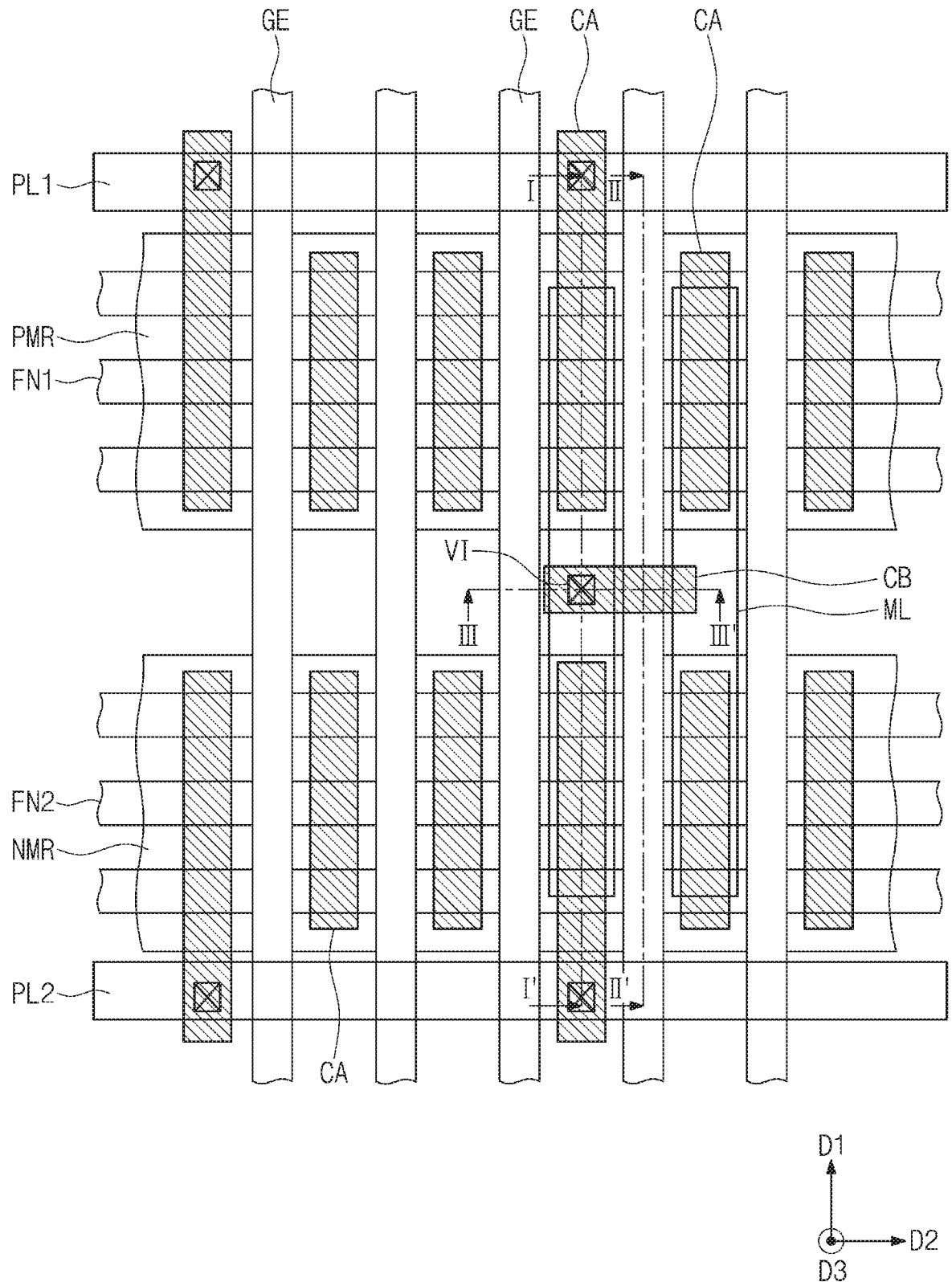
Figure 18B:
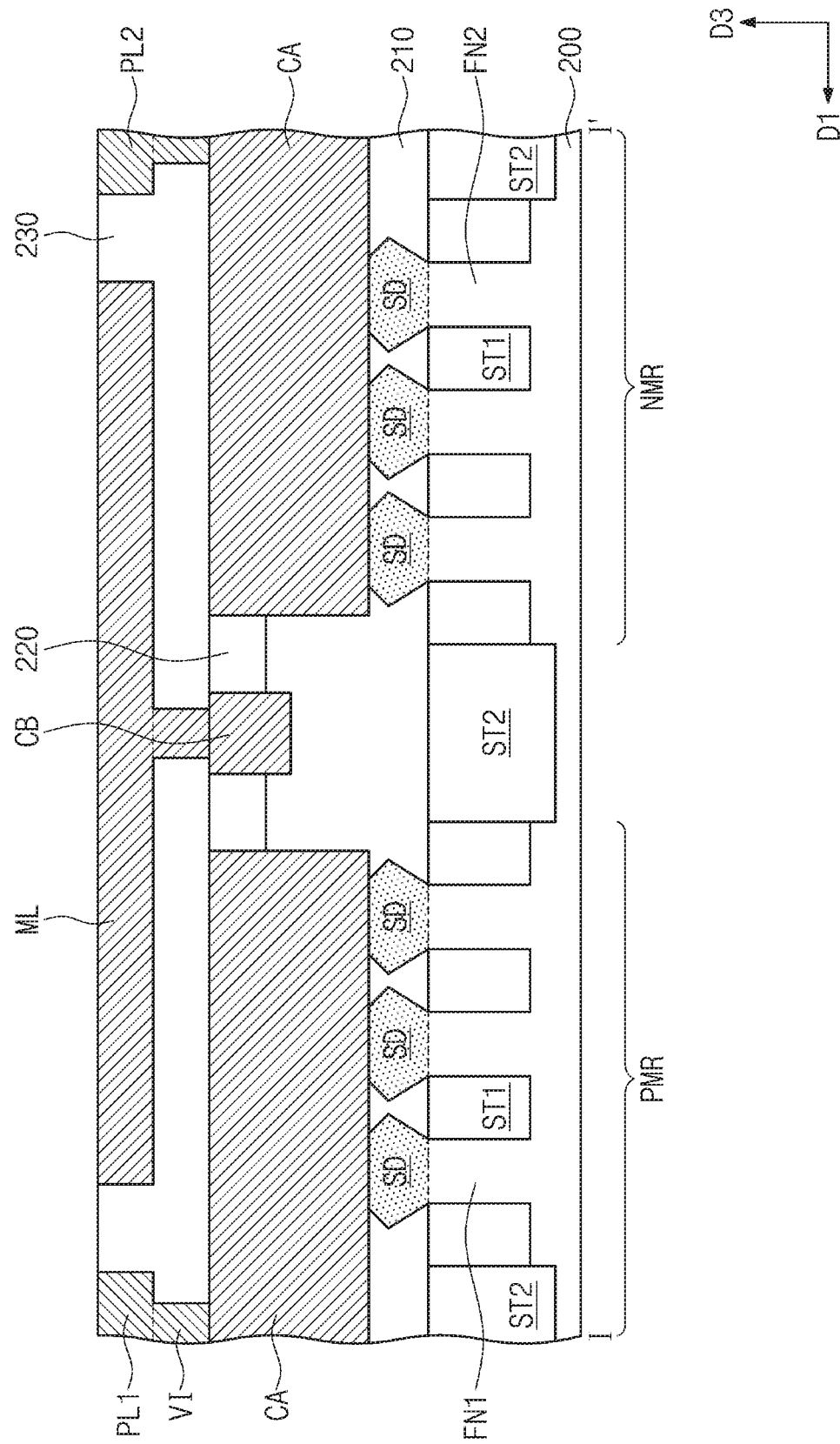
Figure 18C:
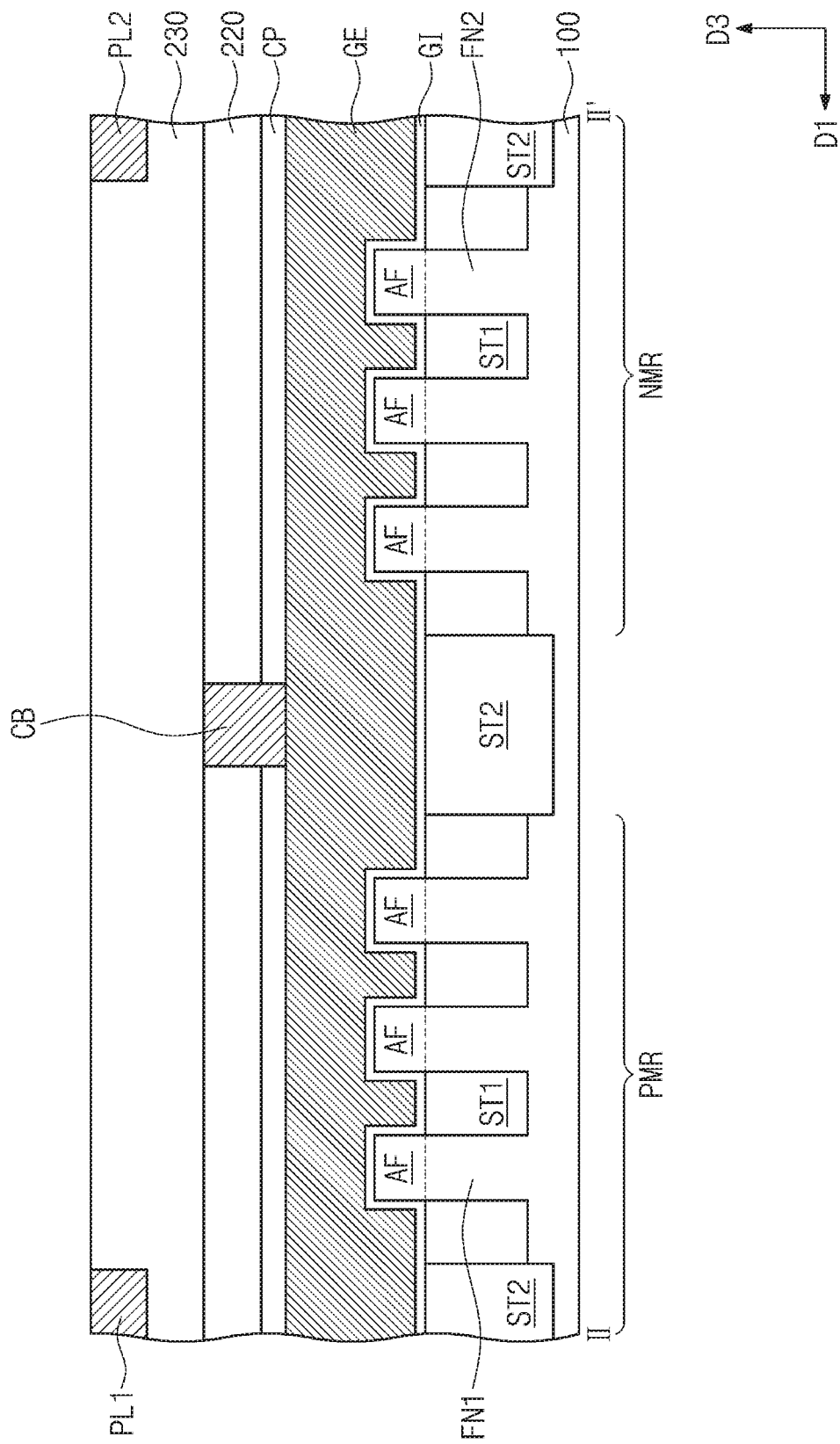
Figure 18D:
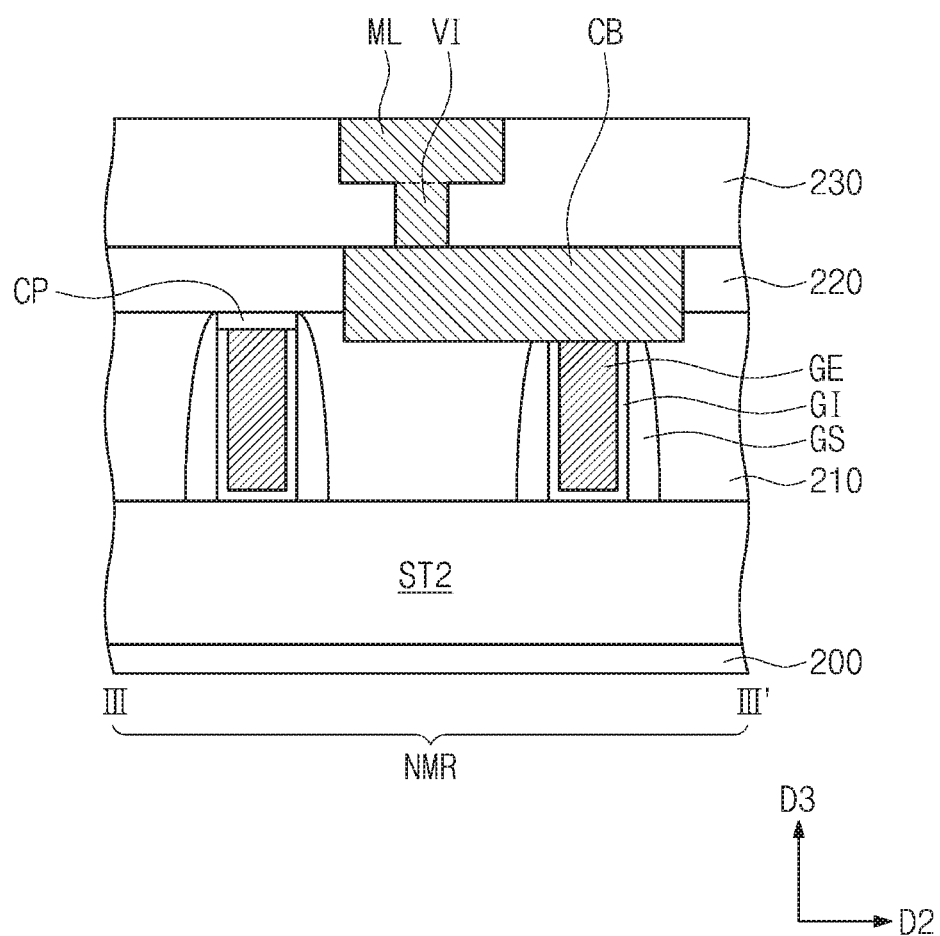

FIGS. 11A, 12A, and 13A illustrate plan views showing a method of manufacturing a semiconductor device according to some example embodiments of inventive concepts. FIGS. 11B, 12B, and 13B illustrate cross-sectional views taken along lines I-I' and II-II' of FIGS. 11A, 12A, and 13A, respectively.

Referring to FIGS. 11A and 11B, a substrate 100 may be provided to include a first region CR and a second region PE. The first region CR may be a cell area of a memory device, and the second region PE may be a peripheral circuit area of a memory device. Additionally or alternatively, the second region PE may be a core area of a memory device. The first region CR of the substrate 100 will now first be discussed hereinafter.

A device isolation layer 102 may be formed to define first active patterns ACT1 on the first region CR of the substrate 100. The substrate 100 may be or include, for example, a silicon substrate, a germanium substrate, or a silicon-germanium substrate. A shallow trench isolation (STI) process may be used to form the device isolation layer 102. The device isolation layer 102 may include a silicon nitride layer, a silicon oxide layer, or a silicon oxynitride layer. When viewed in plan, each of the first active patterns ACT1 may be formed to have a bar shape with a major axis in a third direction D3. All of first, second, and third directions D1, D2 and D3 may be parallel to a top surface of the substrate 100. The first to third directions D1 to D3 may intersect each other.

Gate lines GL may be formed in the substrate 100, running across the first active patterns ACT1. The gate lines GL may be formed to extend in the second direction D2 and to lie spaced apart from each other in the first direction D1. Gate dielectric patterns 104 may be formed between the gate lines GL and the first active patterns ACT1 and between the gate lines GL and the device isolation layer 102. First capping patterns 108 may be formed on the gate lines GL.

An ion implantation process may be performed on each of the first active patterns ACT1 so as to form a first impurity region SD1 and second impurity regions SD2 spaced apart from each other across the first impurity region SD1. For example, the first impurity region SD1 may be formed between a pair of neighboring gate lines GL. A pair of second impurity regions SD2 may be formed on opposite sides of the pair of gate lines GL. The first and second impurity regions SD1 and SD2 may be doped with the same n-type impurity. A depth toward a bottom surface of the substrate 100 may be larger for the first impurity region SD1 than for the second impurity regions SD2.

Bit lines BL may be formed on the substrate 100, running across the first active patterns ACT1. The bit lines BL may be formed to extend in the first direction D1 and to lie spaced apart from each other in the second direction D2. Each of the bit lines BL may be electrically connected to the first impurity region SD1. Second capping patterns 132 may be formed on corresponding bit lines BL. A spacer layer may be conformally deposited on an entire surface of the substrate 100, and then anisotropically etched to form bit line spacers 134 covering opposite sidewalls of each of the bit lines BL.

A first interlayer dielectric layer 110 and a second interlayer dielectric layer 120 may be formed on the substrate 100. Buried contact holes may be formed to penetrate the second and first interlayer dielectric layers 120 and 110 in such a way that the second impurity regions SD2 are exposed to the buried contact holes. The buried contact holes may be filled with a conductive material to form first buried contacts 124. An etching target layer ET may be formed on the second interlayer dielectric layer 120 and the first buried contacts 124. The etching target layer ET may include a conductive material, for example, one or more of semiconductor, conductive metal nitride, metal, and metal-semiconductor compound.

The second region PE of the substrate 100 will now then be discussed hereinafter. At least one second active pattern ACT2 may be formed on the second region PE of the substrate 100. The second active pattern ACT2 may be formed simultaneously with the first active patterns ACT1.

A gate electrode GE may be formed to run across the second active pattern ACT2. A gate dielectric layer 131 may be formed below the gate electrode GE, and a third capping pattern 133 may be formed on the gate electrode GE. Gate electrode spacers 135 may be formed to cover opposite sidewalls of the gate electrode GE. For example, the gate electrode GE may be formed simultaneously with the bit lines BL. The third capping pattern 133 may be formed simultaneously with the second capping pattern 132. The gate electrode spacers 135 may be formed simultaneously with the bit line spacers 134.

An ion implantation process may be performed on the second active pattern ACT2 so as to form third impurity regions SD3. The third impurity regions SD3 may be formed on opposite sides of the gate electrode GE. The third impurity regions SD3 may serve as source/drain regions of a transistor of the second active pattern ACT2 and the gate electrode GE.

The first and second interlayer dielectric layers 110 and 120 may cover the second active pattern ACT2 and the gate electrode GE. Second buried contacts 125 may be formed to penetrate the first and second interlayer dielectric layers 110 and 120 to come into contact with the third impurity regions SD3. For example, the second buried contacts 125 may be formed simultaneously with the first buried contacts 124. The etching target layer ET may be formed to extend onto the second region PE and to cover the second interlayer dielectric layer 120 and the second buried contacts 125 on the second region PE.

Referring to FIGS. 12A and 12B, a first mask layer HM1, a second mask layer HM2, and an under layer UD may be formed to sequentially stack on the first and second regions CR and PE of the substrate 100. First photoresist patterns PP1 may be formed on the under layer UD of the first region CR, and second photoresist patterns PP2 may be formed on the under layer UD of the second region PE. The first and second photoresist patterns PP1 and PP2 may be formed by a photolithography process that uses the extreme ultraviolet (EUV) radiation discussed above with reference to FIGS. 1 to 3. For example, when viewed in plan, each of the first photoresist patterns PP1 may have an island shape, and each of the second photoresist patterns PP2 may have a linear shape.

Referring to FIGS. 13A and 13B, the etching target layer ET may be patterned to form landing pads LP on the first region CR and to form conductive lines CI on the second region PE. The patterning of the etching target layer ET may include performing the first to fifth etching processes ET1 to ET5 discussed above with reference to FIGS. 4 to 8. Each of the landing pads LP may be electrically connected through the first buried contact 124 to the second impurity region SD2. Each of the conductive lines CI may be electrically connected through the second buried contact 125 to the third impurity region SD3.

A third interlayer dielectric layer 130 may be formed to fill between the landing pads LP and between the conductive lines CI. Data storage elements DS may be formed on corresponding landing pads LP. The data storage elements DS may be or include memory elements capable of storing data. The first active patterns ACT1 and the gate lines GL may constitute field effect transistors each of which is used as a switching element. For example, each of the data storage elements DS may be a memory element using at least one of a capacitor, a magnetic tunnel junction (MTJ) pattern, and a variable resistor including a phase change material.

FIGS. 14A, 15A, 16A, 17A, and 18A illustrate plan views showing a method of manufacturing a semiconductor device according to some example embodiments of inventive concepts. FIGS. 14B, 15B, 16B, 17B, and 18B illustrate cross-sectional views taken along line I-I' of FIGS. 14A, 15A, 16A, 17A, and 18A, respectively. FIGS. 14C, 15C, 16C, 17C, and 18C illustrate cross-sectional views taken along line II-II' of FIGS. 14A, 15A, 16A, 17A, and 18A, respectively. FIGS. 14D, 15D, 16D, 17D, and 18D illustrate cross-sectional views taken along line III-III' of FIGS. 14A, 15A, 16A, 17A, and 18A, respectively.

Referring to FIGS. 14A to 14D, a substrate 200 may be provided. For example, the substrate 200 may be or include a silicon substrate, a germanium substrate, or a silicon-on-insulator (SOI) substrate. The substrate 200 is illustrated to have a zone in figures, which zone is a logic cell area on which logic transistors are included in a logic circuit of a semiconductor device. For example, the substrate 200 may be provided on its logic cell area with logic transistors constituting a core or I/O terminals. Example embodiments of inventive concepts, however, are not limited thereto.

First and second active patterns FN1 and FN2 may be formed on an upper portion of the substrate 200. First device isolation patterns ST1 may be formed to fill between the first and second active patterns FN1 and FN2. The first device isolation patterns STI may be recessed to expose upper portions of the first and second active patterns FN1 and FN2. Second device isolation patterns ST2 may be formed on the substrate 200, defining a PMOSFET region PMR and an NMOSFET region NMR. The first active patterns FN1 may be formed on the PMOSFET region PMR, and the second active patterns FN2 may be formed on the NMOSFET region NMR.

A shallow trench isolation (STI) process may be employed to form the first and second device isolation patterns ST1 and ST2. Silicon oxide may be used to form the first and second device isolation patterns ST1 and ST2. For example, the first device isolation patterns ST1 may be formed shallower than the second device isolation patterns ST2. Accordingly, the first device isolation patterns ST1 may be formed separately from the second device isolation patterns ST2. Alternatively, the first and second device isolation patterns ST1 and ST2 may be formed to have substantially the same depth. Accordingly, the first device isolation patterns ST1 may be formed simultaneously with the second device isolation patterns ST2.

Gate electrodes GE may be formed to extend in a first direction D1, while intersecting the first and second active patterns FN1 and FN2. The gate electrodes GE may be spaced apart from each other in a second direction D2. A gate dielectric pattern GI may be formed below each of the gate electrodes GE, and gate spacers GS may be formed on opposite sides of each of the gate electrodes GE. In addition, a capping pattern CP may be formed to cover a top surface of each of the gate electrodes GE.

For example, the formation of the gate electrodes GE may include forming sacrificial patterns to run across the first and second active patterns FN1 and FN2, forming the gate spacers GS on opposite sides of each of the sacrificial patterns, and replacing the sacrificial patterns with the gate electrodes GE.

The gate electrodes GE may include one or more of doped semiconductor, metal, and conductive metal nitride. The gate dielectric pattern GI may include a silicon oxide layer, a silicon oxynitride layer, and/or a high-k dielectric layer whose dielectric constant is greater than that of a silicon oxide layer. Each of the capping pattern CP and the gate spacers GS may include one or more of a silicon oxide layer, a silicon nitride layer, and a silicon oxynitride layer.

Source/drain patterns SD may be formed on upper portions of the first and second active patterns FN1 and FN2. Each of the source/drain patterns SD may be formed between a pair of neighboring gate electrodes GE. The source/drain patterns SD on the PMOSFET region PMR may be doped with p-type impurities, and the source/drain patterns SD on the NMOSFET region NMR may be doped with n-type impurities; however, inventive concepts are not limited thereto, and the source/drain patterns SD of the NMOSFET region NMR and the PMOSFET region PMR may be doped with other impurities.

The source/drain patterns SD may be epitaxial patterns, which epitaxial patterns may be formed by a selective epitaxial growth process. The first and second active patterns FN1 and FN2 may be recessed on their upper portions, and then the recessed portions may be used as seed layers when the epitaxial growth process is performed.

A first interlayer dielectric layer 210 and a second interlayer dielectric layer 220 may be sequentially formed to cover the source/drain patterns SD and the gate electrodes GE. Each of the first and second interlayer dielectric layers 210 and 220 may be formed of a silicon oxide layer or a silicon oxynitride layer.

Referring to FIGS. 15A to 15D, a first mask layer HM1, a second mask layer HM2, and a first under layer UD may be formed to sequentially stack on the second interlayer dielectric layer 220. A first photoresist pattern PP1 may be formed on the first under layer UD. The first photoresist pattern PP1 may be formed by a photolithography process that uses the extreme ultraviolet (EUV) radiation discussed above with reference to FIGS. 1 to 3. The first photoresist pattern PP1 may be formed to have a plurality of first openings OP1. When viewed in plan, the first openings OP1 may overlap corresponding source/drain patterns SD. For example, when viewed in plan, each of the first openings OP1 may be formed between a pair of neighboring gate electrodes GE.

Referring to FIGS. 16A to 16D, the first mask pattern HP1 may be used as an etching mask to pattern the first and second interlayer dielectric layers 210 and 220, which step may form second openings OP2 exposing the source/drain patterns SD. The first and second interlayer dielectric layers 210 and 220 may be the etching target layer ET discussed above with reference to FIGS. 1 to 8. The patterning of the first and second interlayer dielectric layers 210 and 220 may include performing the first to fifth etching processes ET1 to ET5 discussed above with reference to FIGS. 4 to 8. The first mask pattern HP1 may originate from the first mask layer HM1.

Referring to FIGS. 17A to 17D, a remaining first mask pattern HP1 may be selectively removed. A mold layer 250 may be formed on the second interlayer dielectric layer 220. The mold layer 250 may be formed to completely fill the second openings OP2.

A third mask pattern HP3 may be formed on the mold layer 250. The third mask pattern HP3 may be used as an etching mask to pattern the mold layer 250 and the first and second interlayer dielectric layers 210 and 220, which step may form a third opening OP3 exposing a top surface of the gate electrode GE. The formation of the third opening OP3 may be same as the formation of the second openings OP2 discussed above. For example, the formation of the third opening OP3 may include forming on the mold layer 250 a third mask layer, a fourth mask layer, a second under layer, and a second photoresist pattern, and then performing the first to fifth etching processes ET1 to ET5 discussed above with reference to FIGS. 4 to 8. The third mask pattern HP3 may originate from the third mask layer.

Referring to FIGS. 18A to 18D, a remaining third mask pattern HP3 and a remaining mold layer 250 may be selectively removed. The second openings OP2 and the third opening OP3 may be filled with a conductive material to respectively form a first conductive pattern CA and a second conductive pattern CB.

A third interlayer dielectric layer 230 may be formed on the second interlayer dielectric layer 220. The third interlayer dielectric layer 230 may be formed of a silicon oxide layer or a silicon oxynitride layer. First and second power lines PL1 and PL2 and conductive lines ML may be formed in the third interlayer dielectric layer 230. Each of the first and second power lines PL1 and PL2 and the conductive lines ML may include a via VI coupled either to the first conductive pattern CA or the second conductive pattern CB that is below a corresponding one of the first and second conductive patterns PL1 and P2 and the conductive lines ML. The formation of the first and second power lines PL1 and PL2 and the conductive lines ML may be similar to the formation of the first and second conductive patterns CA and CB discussed above. For example, the formation of the first and second power lines PL1 and PL2 and the conductive lines ML may use the method of forming a target pattern discussed above with reference to FIGS. 1 to 8.

According to inventive concepts, a method of manufacturing a semiconductor device may effectively remove a photoresist material (e.g., scum) remaining in an extreme ultraviolet (EUV) photolithography process. As a result, target patterns may be eventually formed to have desired shapes on intended positions.

This detailed description of inventive concepts should not be construed as limited to the example embodiments set forth herein, and it is intended that inventive concepts cover the various combinations, the modifications and variations of this invention without departing from the spirit and scope of inventive concepts. The appended claims should be construed to include other embodiments.

What is claimed is:

1. A method of manufacturing a semiconductor device, the method comprising:
    stacking an etching target layer, a first mask layer, an under layer, and a photoresist layer on a substrate;
    irradiating extreme ultraviolet (EUV) radiation on the photoresist layer to form a photoresist pattern; and
    performing a nitrogen plasma treatment on the photoresist pattern while using the first mask layer as an etching stop layer, the performing continuing until a top surface of the first mask layer is exposed; and
    patterning the first mask layer to form a first mask pattern using the photoresist pattern and the under pattern as a first etching mask,
    wherein, during the performing the nitrogen plasma treatment, the under layer is etched to form an under pattern below the photoresist pattern, wherein patterning the first mask layer comprises performing a dry etching process,
wherein the dry etching process uses an etching gas including at least one of $SF_6$, HBr, or $BCl_3$.

2. The method of claim 1, wherein
the irradiating comprises leaving a scum close to the photoresist pattern, and
the performing comprises removing the scum.

3. The method of claim 1, wherein the performing includes using at least one of an inductively coupled plasma source or a capacitively coupled plasma source.

4. The method of claim 1, wherein the under layer comprises an organic polymer including carbon, and
wherein, during the performing, nitrogen and the carbon included in the under layer react to produce carbon nitride.

5. The method of claim 1, wherein the performing includes using a process gas consisting essentially of nitrogen.

6. The method of claim 1, wherein the first mask layer comprises at least one of a silicon layer, a silicon oxide layer, or a silicon nitride layer.

7. The method of claim 1, further comprising:
patterning the etching target layer to form a target pattern using the first mask pattern as a second etching mask.

8. The method of claim 7, further comprising:
forming a second mask layer between the etching target layer and the first mask layer,
wherein the patterning the etching target layer patterns the second mask layer to form a second mask pattern while using the first mask pattern as the second etching mask.

9. The method of claim 8, wherein the second mask layer comprises at least one of spin-on-hardmask (SOH) layer, a spin-on-carbon (SOC) layer, or an amorphous carbon layer.

10. The method of claim 7, further comprising:
forming a data storage element on the target pattern,
wherein the target pattern is electrically connected to an active pattern of the substrate.

11. The method of claim 7, before the patterning the etching target layer, further comprising:
forming a gate electrode to run across an active pattern of the substrate;
forming on an upper portion of the active pattern a source/drain pattern adjacent to a side of the gate electrode; and
after forming the target pattern, filling an opening of the target pattern with a conductive material to form a conductive pattern,
wherein the conductive pattern is electrically connected to at least one of the gate electrode and the source/drain pattern.

12. A method of manufacturing a semiconductor device, the method comprising:
forming a gate electrode to run across an active pattern of a first region of a substrate;
forming an impurity region in the active pattern, the impurity region adjacent to a side of the gate electrode;
forming a conductive layer on the gate electrode; and
patterning the conductive layer to form a first conductive pattern electrically connected to the impurity region,
wherein the patterning includes,
forming a photoresist layer on the conductive layer,
irradiating extreme ultraviolet (EUV) radiation on the photoresist layer to form a photoresist pattern, and
performing a nitrogen plasma treatment on the photoresist pattern,
wherein the performing includes using a process gas consisting essentially of nitrogen.

13. The method of claim 12, wherein the patterning further comprises:
forming a mask layer and an under layer, the under layer being between the conductive layer and the photoresist layer,
wherein, during the performing, the under layer is etched to form an under pattern below the photoresist pattern, and
wherein the performing includes using the mask layer as an etching stop layer and continuing until a top surface of the mask layer is exposed.

14. The method of claim 13, wherein
the under layer comprises an organic polymer including carbon,
the mask layer comprises at least one of a silicon layer, a silicon oxide layer, or a silicon nitride layer, and
during the performing, nitrogen and the carbon included in the under layer react to produce carbon nitride.

15. The method of claim 12, further comprising:
forming a second conductive pattern on a second region of the substrate; and
forming a data storage element on the second conductive pattern,
wherein the forming the second conductive pattern is performed simultaneously with the forming the first conductive pattern, and
wherein the first conductive pattern has a linear shape extending in one direction.

16. A method of manufacturing a semiconductor device, the method comprising:
forming a gate electrode to run across an active pattern of a substrate; and
forming on an upper portion of the active pattern a source/drain pattern adjacent to a side of the gate electrode,
forming an interlayer dielectric layer on the substrate;
forming an opening in the interlayer dielectric layer; and
filling the opening with a conductive material to form a conductive pattern,
wherein the conductive pattern is electrically connected to at least one of the gate electrode or to the source/drain pattern,
wherein forming the opening includes,
forming a photoresist layer on the interlayer dielectric layer,
irradiating extreme ultraviolet (EUV) radiation on the photoresist layer to form a photoresist pattern, and
performing a nitrogen plasma treatment on the photoresist pattern
wherein the performing includes using a process gas consisting essentially of nitrogen.

17. The method of claim 16,
wherein, during the performing, the under layer is etched to form an under pattern below the photoresist pattern, and
wherein the performing includes using a mask layer as an etching stop layer and continuing until a top surface of the mask layer is exposed.

18. The method of claim 17, wherein
the under layer comprises an organic polymer including carbon,
the mask layer comprises at least one of a silicon layer, a silicon oxide layer, or a silicon nitride layer, and during the performing the nitrogen plasma treatment, nitrogen and the carbon included in the under layer react to produce carbon nitride.

* * * * *